(12) United States Patent
Kohara et al.

(10) Patent No.: US 8,258,409 B2
(45) Date of Patent: Sep. 4, 2012

(54) CIRCUIT BOARD AND CIRCUIT DEVICE

(75) Inventors: Yasuhiro Kohara, Gifu (JP); Kiyoshi Shibata, Gifu (JP); Masayuki Nagamatsu, Gifu (JP); Ryosuke Usui, Aichi (JP); Toshiya Shimizu, Gifu (JP)

(73) Assignee: Sanyo Electric Co., Ltd. (JP)

( * ) Notice: Subject to any disclaimer, the term of this patent is extended or adjusted under 35 U.S.C. 154(b) by 1195 days.

(21) Appl. No.: 12/058,040

(22) Filed: Mar. 28, 2008

(65) Prior Publication Data

US 2008/0236879 A1  Oct. 2, 2008

(30) Foreign Application Priority Data

Mar. 30, 2007  (JP) ................................ 2007-094574

(51) Int. Cl.
*H05K 1/00* (2006.01)
(52) U.S. Cl. ...................................................... 174/261
(58) Field of Classification Search .................... 174/261
See application file for complete search history.

(56) References Cited

U.S. PATENT DOCUMENTS

| | | | | |
|---|---|---|---|---|
| 4,151,543 | A | * | 4/1979 | Hayakawa et al. ............ 257/668 |
| 5,278,429 | A | * | 1/1994 | Takenaka et al. ............. 257/678 |
| 5,362,926 | A | * | 11/1994 | Fukuda et al. ................ 174/256 |
| 6,204,454 | B1 | * | 3/2001 | Gotoh et al. .................. 174/255 |
| 7,595,553 | B2 | * | 9/2009 | Nagamatsu et al. ........... 257/731 |
| 7,612,445 | B2 | * | 11/2009 | Murai et al. .................. 257/696 |
| 2002/0190377 | A1 | | 12/2002 | Igarashi et al. | |

FOREIGN PATENT DOCUMENTS

| | | |
|---|---|---|
| CN | 1392601 A | 2/2003 |
| JP | 08-222828 | 8/1996 |
| JP | 10-340925 | 12/1998 |
| JP | 2002-076610 | 3/2002 |
| JP | 2003-224230 | 8/2003 |
| JP | 2003-324263 | 11/2003 |
| JP | 2004-179578 | 6/2004 |
| JP | 2004-228364 | 8/2004 |
| JP | 2006-287034 | 10/2006 |

OTHER PUBLICATIONS

Office Action for Japanese Application No. 2010-025584 dated Aug. 30, 2011.

* cited by examiner

*Primary Examiner* — Chau Nguyen
(74) *Attorney, Agent, or Firm* — Fish & Richardson P.C.

(57) ABSTRACT

Provided are a circuit board with enhanced moisture resist and the method of manufacturing the circuit board, and a circuit device and a method of manufacturing the circuit device. A circuit board of the present invention includes: a substrate; wirings formed on the main surface of the substrate; a cover layer covering the wirings excluding the regions to be connectors; back electrodes formed on the bottom surface of the substrate; and through-hole electrodes formed so as to penetrate the substrate, and thereby connecting the wirings and the back electrodes. On surfaces of each of the wirings in this circuit board, convex portions on the periphery of the substrate are set larger in width than convex portions in a center portion of the substrate. With this configuration, adhesion reliability between the wirings and the cover layer under a thermal cycle load can be enhanced.

7 Claims, 18 Drawing Sheets

36  38

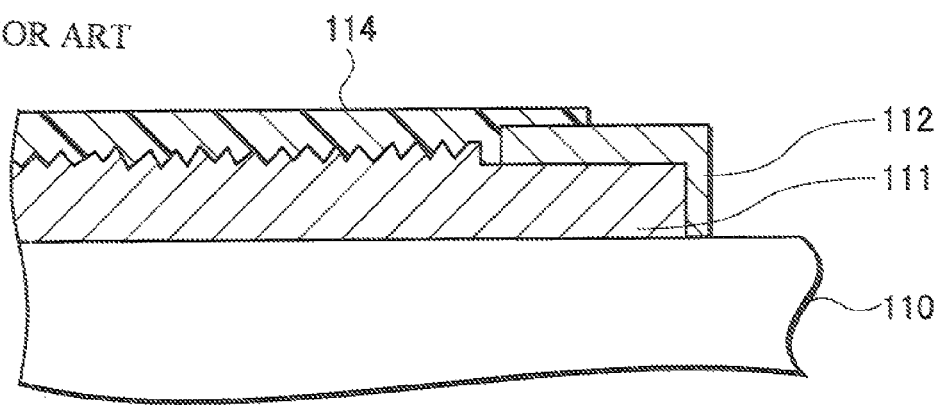
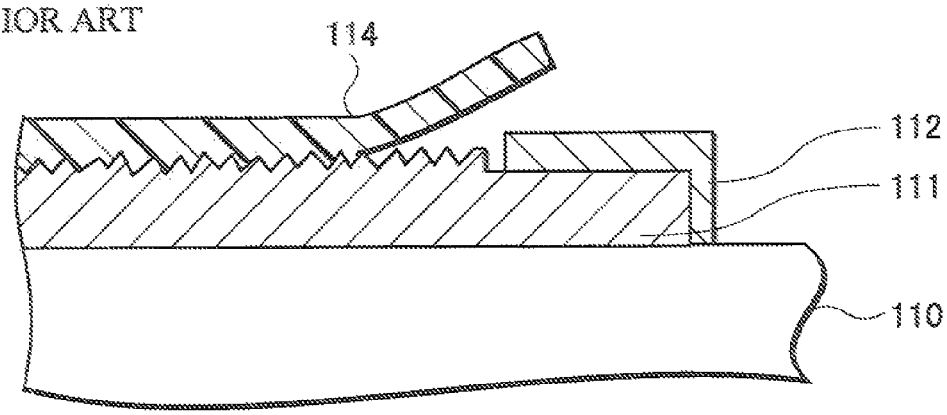

US 8,258,409 B2

CIRCUIT BOARD AND CIRCUIT DEVICE

This application claims priority from Japanese Patent Application Number JP2007-094574 filed on Mar. 30, 2007, the content of which is incorporated herein by reference in its entirety.

BACKGROUND OF THE INVENTION

1. Field of the Invention

The present invention relates to a circuit board and the method of manufacturing the circuit board, and a circuit device and a method of manufacturing the circuit device. In particular, the present invention relates to a circuit board having a structure in which wirings formed on a main surface of a substrate are covered with a cover layer, and a method of manufacturing the circuit board. Moreover, the present invention also relates to a circuit device provided with such a circuit board and a method of manufacturing the circuit device.

2. Description of the Related Art

Electronic equipments such as cellular phones have been reduced in size, and have been made to include enhanced functionality. Along with such development, most circuit devices housed in such electronic equipments include fine wirings. A circuit device with a circuit board 107 will be described below with reference to FIG. 16. This technology is described for instance in Japanese Patent Application No. 2003-324263.

As shown in FIG. 16, a circuit device 100 has a structure in which a circuit element (semiconductor element 105) is mounted on a first wiring layer 102A formed in the upper surface of the circuit board 107.

The circuit board 107 includes a substrate 101 made of resin such as glass epoxy, and wiring layers formed on the upper and bottom surfaces of the substrate 101. Specifically, the first wiring layer 102A and a second wiring layer 102B are formed on the upper surface of the substrate 101. The first wiring layer 102A is placed on the second wiring layer 102B with an insulating layer 103 interposed therebetween. In addition, on the bottom surface of the substrate 101, third and fourth wiring layers 102C and 102D are stacked in a manner that the fourth wiring layer 102D is placed under the third wiring layer 102C with a different insulating layer 103 interposed therebetween. The first and second wiring layers 102A and 102B are connected to each other at predetermined positions with connection portions 104 provided so as to penetrate the insulating layer 103, while the third and fourth wiring layers 102C and 102D are connected to each other at predetermined positions with different connection portions 104 provided so as to penetrate the different insulating layer 103. Moreover, the second and third wiring layers 102B and 102C are connected to each other at predetermined positions with still different connection portions 104 provided so as to penetrate the substrate 101. Here, the thickness of the circuit board 107 is approximately 1 mm, for example.

The first wiring layer 102A, which is the uppermost wiring layer, is covered with a cover layer 109, and electrical connection regions (the parts to each of which a thin metallic wire 108 is to be connected) of the first wiring layer 102A are exposed from openings formed by removing parts of the cover layer 109. Here, the cover layer 109 is made of a resin material such as epoxy resin.

On the upper surface of the cover layer 109, the semiconductor element 105 is adhered. Here, the semiconductor element 105 is adhered at its bottom surface to the cover layer 109 by using an insulating adhesive or the like. Electrodes provided on the upper surface of the semiconductor element 105 are electrically connected to the first wiring layer 102A through the thin metallic wires 108.

Moreover, the upper surface of the circuit board 107 is covered with a sealing resin 106 so that the sealing resin 106 can cover the semiconductor element 105 and the thin metallic wires 108.

A manufacturing method of the circuit board 107 having the above-described structure is as follows. Firstly, the second wiring layer 102B and the third wiring layer 102C are formed respectively on the upper surface and the bottom surface of the substrate 101 made of a resin material such as epoxy resin. These wiring layers are formed by means of the etching of conductive films adhered on the upper and bottom surfaces of the substrate 101, or a plating process performed selectively on the upper and bottom surfaces of the substrate 101. Then, the connection portions 104 that penetrate the substrate 101 are formed to connect the second wiring layer 102B and the third wiring layer 102C. Thereafter, the second and third wiring layers 102B and 102C are covered with the insulating layers 103, respectively On surfaces of the respective insulating layers 103, the first wiring layer 102A and the fourth wiring layer 102D are formed. The forming method of the first and fourth wiring layers 102A and 102D are same as that of the second and third wiring layers 102B and 102C described above. Then, the connection portions 104 that penetrate the corresponding insulating layer 103 are formed to connect the first wiring layer 102A and the second wiring layer 102B. Thereafter, the cover layer 109 is formed so as to cover the first wiring layer 102A, which is the uppermost wiring layer, and then is partially removed to form openings so that the electrical connection regions of the first wiring layer 102A can be exposed from the openings to the outside.

However, the circuit device 100 having the above-described structure has a problem that the adhesion between the first wiring layer 102A, which is the uppermost wiring layer, and the cover layer 109 is insufficient. Specifically, as the size of the circuit integrated on the semiconductor element 105 increases, the calorific value attributable to the operation of the semiconductor element 105 also increases. As a result, thermal stress occurs at the interface between the first wiring layer 102A and the cover layer 109 since the thermal expansion coefficient of the first wiring layer 102A made of a metal such as copper is significantly different from that of the cover layer 109 made of resin. If thermal stress is applied to the interface of the layers 102A and 109 a large number of times, the cover layer 109 may be exfoliated from the first wiring layer 102A.

Japanese Patent Application Publication No. 2002-76610 discloses a method to solve the above-described problem. The technical features of this Publication will be described below with reference to FIG. 17. As shown in FIG. 17, a conductor circuit 111 is formed on the upper surface of an insulating circuit board 110. In addition, surfaces of the conductor circuit 111 are uniformly roughened in order to prevent the problem attributable to the difference between the thermal difference coefficients of the conductor circuit 111 and the insulating resin portion.

Specifically, in Japanese Patent Application Publication No. 2002-76610, etching solution including hydrogen peroxide water, sulfuric acid, tetrazole and the like, is used for patterning for the conductor circuit 111, to form the conductor circuit 111 with the above-described structure. In the etching process, compounds 112 attach to the surfaces of the conductor circuit 111 through this patterning. As a result, etching progresses evenly from the surfaces, excluding the portions to which the compounds 112 are attached, of the conductor circuit 111, so that the surfaces of the conductor circuit 111 are uniformly roughened. According to this Publication, with such uniformly roughened surfaces, the adhesion strength between the conductor circuit 111 and the resin portion can be increased, and hence, the problem of exfoliation of the conductor circuit 111 and the resin portion can be avoided.

However, the technical features disclosed in Japanese Patent Application Publication No. 2002-76610 lead to a problem that the conductor circuit 111 is exfoliated from a solder resist. FIG. 18A is a cross-sectional view showing a region around the conductor circuit 111, and FIG. 18B is a cross-sectional view showing a state in which a cover layer 114 (solder resist) is exfoliated from the conductor circuit 111.

As shown in FIG. 18A, the conductor circuit 111 is formed on the upper surface of the circuit board 110, and end portions (shown in FIG. 18 is the right end portion) of the conductor circuit 111 are each covered with a plating film 112 formed by means of electroplating. Moreover, the cover layer 114 made of a resin material is formed so as to cover the upper surfaces of the conductor circuit 111 and the circuit board 110. While covering the upper surface of the conductor circuit 111, the cover layer 114 also covers part of surfaces of the plating films 112.

The phenomenon of the exfoliation of the cover layer 114 thus formed will be described with reference to FIG. 18B. As described above, since the thermal expansion coefficient of the conductor circuit 111 is different from that of the cover layer 114, thermal stress occurs at the interface between the conductor circuit 111 and the cover layer 114 each time the temperature changes. Here, the thermal stress is large at the end portions of the cover layer 114. As shown in FIG. 18B, the amount of aforementioned thermal stress F1, which is the stress occurs around the inner part of the cover 114 (on the left side in FIG. 18B), is small, while the amount of aforementioned thermal stress F2, which is the stress occurs around the end portions of the cover layer 114, is relatively large. In addition, the overall adhesion strength between the conductor circuit 111 and the cover layer 114 is approximately the same, since the roughness degree is approximately the same across the surfaces of the conductor circuit 111.

Due to the above, in the peripheral region of the circuit board 110, large thermal stress is applied to the interface between the conductor circuit 111 and the cover layer 114 each time the temperature changes. As a result, a problem arises, in this region, that the cover layer 114 is exfoliated from the conductor circuit 111. If the cover layer 114 is exfoliated, moisture ingress is likely to occur at the interface, and hence, the moisture resistance is deteriorated.

SUMMARY OF THE INVENTION

The present invention has been made in view of the above problems. A major object of the present invention is to provide a circuit board with enhanced moisture resistance and a manufacturing method of such a circuit board, and a circuit device and a manufacturing method of the circuit.

A circuit board of the present invention includes: a substrate; an wiring formed on a main surface of the substrate, and including a connector; and a cover layer covering the wiring excluding the connector. In the circuit board, the connector of the wiring is positioned in a region surrounding a circuit-element-mounting-region where a circuit element is designed to be mounted. The circuit-element-mounting region is defined on the main surface of the substrate. In addition, on a surface of the wiring, convex portions in the region surrounding the circuit-element-mounting-region are set larger in width than convex portions in a center part of the circuit-element-mounting-region.

An aspect of the present invention provides a circuit device includes a circuit board and a circuit element mounted on the circuit board. The circuit board includes: a substrate, an wiring formed on a main surface of the substrate, and including a connector electrically connected to the circuit element; and a cover layer covering the wiring excluding the connector. In the circuit board, the connector of the wiring is positioned in a region surrounding a circuit-element-mounting-region where a circuit element is designed to be mounted, the circuit-element-mounting region being on the main surface of the substrate. In addition, on a surface of the wiring, convex portions positioned in the region surrounding the circuit-element-mounting-region are set larger in width than convex portions in a center part of the circuit-element-mounting-region.

Another aspect of the present invention provides a circuit device including a circuit board and a circuit element mounted on the circuit board. Here, the circuit board is a semiconductor element including a plurality of electrodes provided on a main surface thereof. Moreover, the circuit board includes: a substrate; an wiring formed on a main surface of the substrate, and including a connector electrically connected to the semiconductor element; and a cover layer covering the wiring excluding the connector. In the circuit board, the connector of the wiring is provided in the periphery of the substrate. In addition, on a surface of the wiring, convex portions in the periphery of the substrate are set larger in width than convex portions in a center region of the substrate.

A still another aspect of the present invention provides a method of manufacturing a circuit board including a substrate and an wiring formed on a main surface of the substrate and covered with a cover layer. The method includes: a first step of forming convex portions on a surface of the wiring so as to set convex portions in a region surrounding a circuit-element-mounting-region of the substrate larger in width than convex portions in a center part of the circuit-element-mounting-region, the circuit-element-mounting-region being a region where a circuit element is designed to be mounted; and a second step of forming the cover layer to cover a surface of the wiring and the main surface of the substrate.

A still another aspect of the present invention provides a method of manufacturing a circuit board including a substrate and an wiring formed on a main surface of the substrate and covered with a cover layer. The method includes: a first step of forming, on the main surface of the substrate, wirings having connectors provided so as to surround a circuit-element-mounting-region where a circuit element is designed to be mounted; a second step of adhering an electroless plating film on the main surface of the substrate and surfaces of the wirings; a third step of covering the main surface of the substrate and the wirings with an etching resist while forming first openings in the etching resist, on and around the connectors of the wirings on the main surface of the substrate; a fourth step of performing etching to remove parts, exposed from the first openings, of the electroless plating film; a fifth step of forming a plating resist covering the wirings, on the main surface of the substrate while forming second openings in the plating resist, on the regions provided with the connectors; a sixth step of adhering an electroplating film to the connectors, exposed from the second openings, of the wirings, by means of electroplating using the electroless plating film as an electrode; a seventh step of causing the wirings to be electrically independent from each other by removing the electroless plating film covering the main surface of the substrate; and an eighth step of forming a cover layer on the main surface of the substrate so as to cover the wirings while forming third openings in the cover layer, on the connectors to which the electroplating film is adhered.

A still another aspect of the present invention provides a method of manufacturing a circuit device. The method includes the steps of: providing a circuit board including a substrate, an wiring that is formed on a main surface of the substrate, and that includes a connector, and a cover layer that covers the wiring excluding the connector; and mounting, on the circuit board, a circuit element electrically connected to the wiring. In the circuit board, the connector of the wiring is positioned in a region surrounding a circuit-element-mounting-region where a circuit element is designed to be mounted. The circuit-element-mounting region is defined on the main surface of the substrate. On a surface of the wiring, convex portions in the region surrounding the circuit-element-mounting-region are set larger in width than convex portions in a center part of the circuit-element-mounting-region.

Another aspect of the present invention provides a method of manufacturing a circuit device. The method includes the steps of: forming a circuit board including a substrate and wirings formed on a main surface of the substrate and covered with a cover layer; and mounting, on the circuit board, a circuit element electrically connected to the wirings. The step of forming the circuit board includes: a first step of forming, on the main surface of the substrate, wirings having connectors provided so as to surround a circuit-element-mounting-region where a circuit element is designed to be mounted; a second step of adhering an electroless plating film on the main surface of the substrate and surfaces of the wirings; a third step of covering the main surface of the substrate and the wirings with an etching resist while forming first openings in the etching resist, on and around the connectors of the wirings on the main surface of the substrate; a fourth step of performing etching to remove parts, exposed from the first openings, of the electroless plating film; a fifth step of forming a plating resist covering the wirings, on the main surface of the substrate while forming second openings in the plating resist, on the regions provided with the connectors; a sixth step of adhering an electroplating film to the connectors, exposed from the second openings, of the wirings, by means of electroplating using the electroless plating film as an electrode; a seventh step of causing the wirings to be electrically independent from each other by removing the electroless plating film covering the main surface of the substrate; and an eighth step of forming a cover layer on the main surface of the substrate so as to cover the wirings while forming third openings in the cover layer, on the connectors to which the electroplating film is adhered.

A circuit board of the present invention includes: a substrate; an wiring formed on a main surface of the substrate, and having an external terminal portion; and a cover layer covering the wiring excluding the external terminal portion. In the circuit board, the cover layer includes an opening for exposing the external terminal portion of the wiring. In addition, on a surface, covered with the cover layer, of the wiring, convex portions in a region around the periphery of the opening are set larger in width than convex portions outside the region around the periphery of the opening.

In the circuit boards and the circuit devices of the present invention, on a surface of each wiring, the concave portions in the periphery of the circuit board are set larger in width than concave portions in a center part of the circuit board. This configuration makes it possible to prevent exfoliation of the cover layer from each wiring in the center part of the circuit board by enhancing the adhesion strength between each wiring and the cover layer. Moreover, in the periphery of the circuit board, the widths of the convex portions on the surface of each wiring are relatively large, so that thermal stress (stress) can be distributed. Thereby, exfoliation of the cover layer from the wiring can be prevented in the periphery of the circuit board.

Moreover, the manufacturing methods of the present invention makes it possible to efficiently manufacture a circuit board having one of the configurations mentioned above and a circuit device having one of the configurations mentioned above. Specifically, on a surface of each wiring, the convex portions in the periphery of the wiring can be set larger in width than the convex portions in the center part of the wiring, by using etchants having different properties respectively in the step of performing etching on the periphery of the wiring and in the step of performing etching on the center part of the wiring. In other words, on a surface of each wiring, the convex portions positioned on the center portion of the circuit board can be set smaller in width than the convex portions positioned on the periphery of the circuit board.

Furthermore, in some cases, the electroless plating film formed so as to cover the entire upper surface of the circuit board is used as tinned wires for an electroplating process. In such a case, a step of removing the electroless plating film not to be used any longer and a step of performing etching on a surface, positioned in the periphery, of each wiring can be performed as one step. Accordingly, an increase in the number of steps resulting from forming surfaces of each wiring with different degrees of surface roughness can be prevented.

BRIEF DESCRIPTION OF THE DRAWINGS

FIGS. 18A and 18B are cross-sectional views of the circuit device according to the second related art.

DESCRIPTION OF THE INVENTIONS

First Preferred Embodiment

Figure 1A:
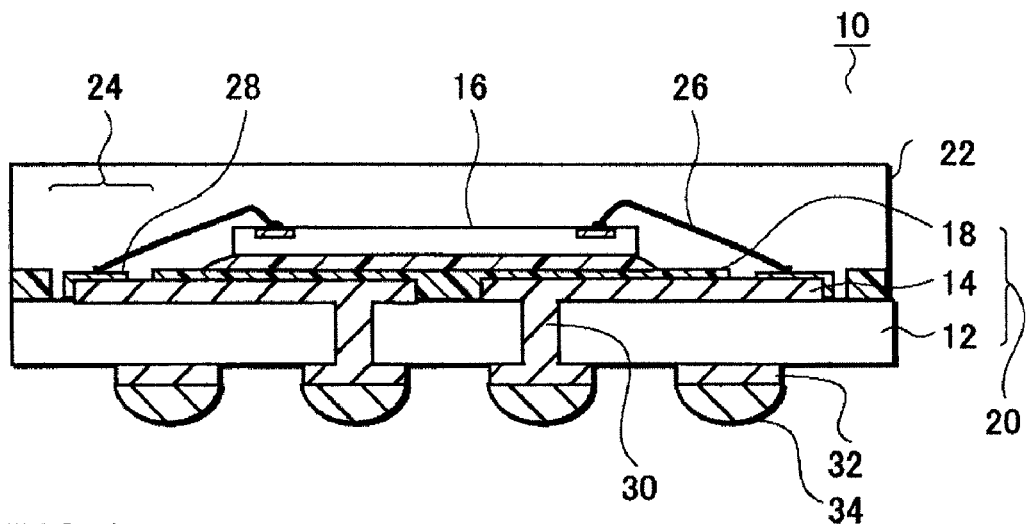
FIG. 1A is a cross-sectional view.
Figure 1B:
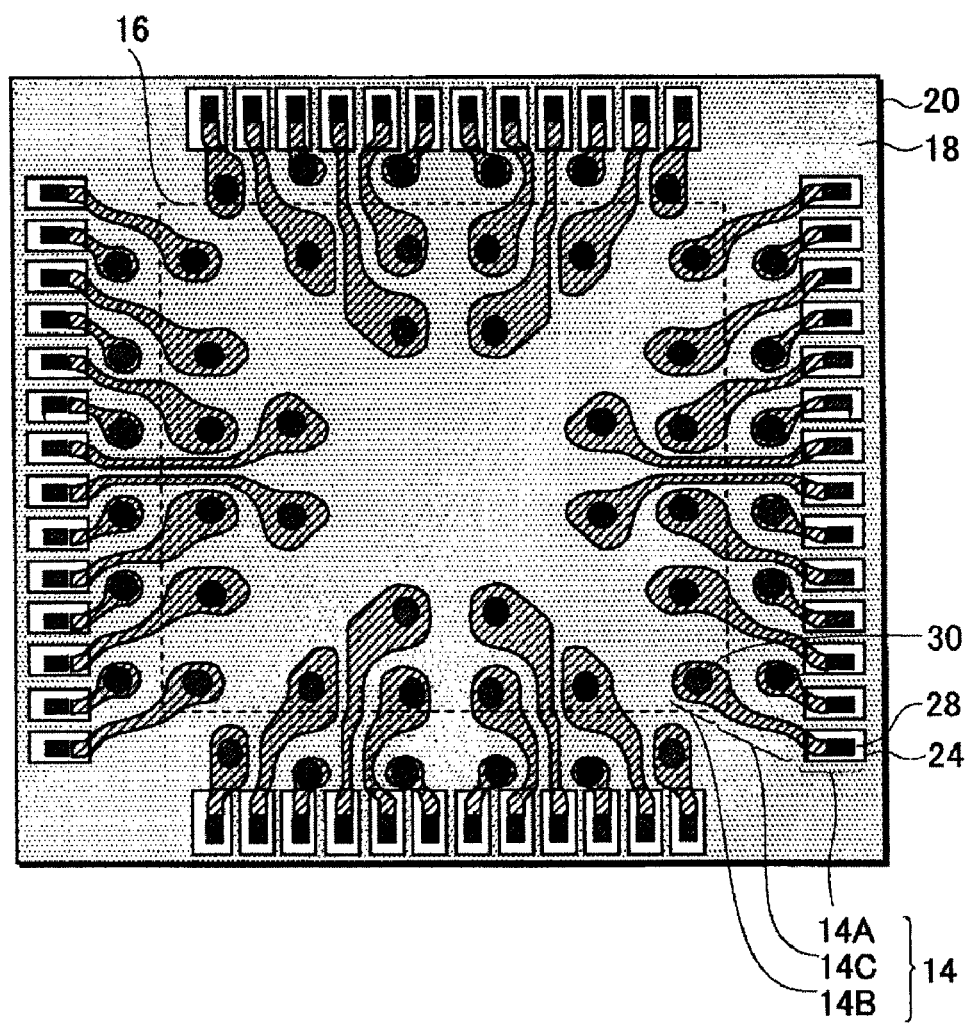
FIG. 1B is a plan view, of a circuit device according to a first preferred embodiment of the present invention.
Figure 2A:
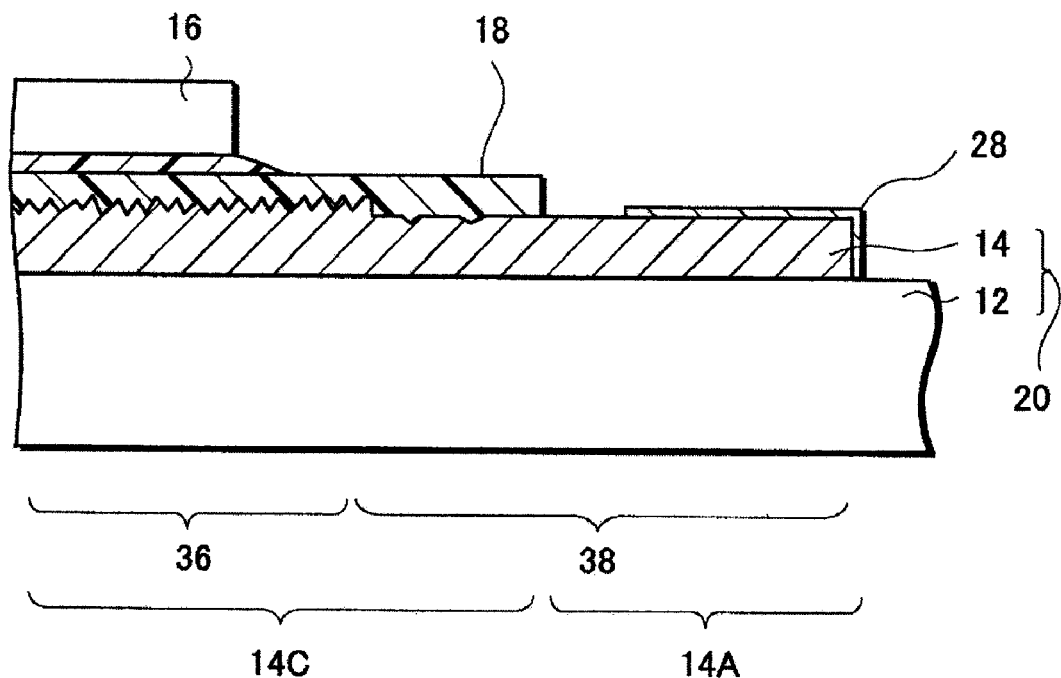
FIG. 2A is a cross-sectional view.
Figure 2B:
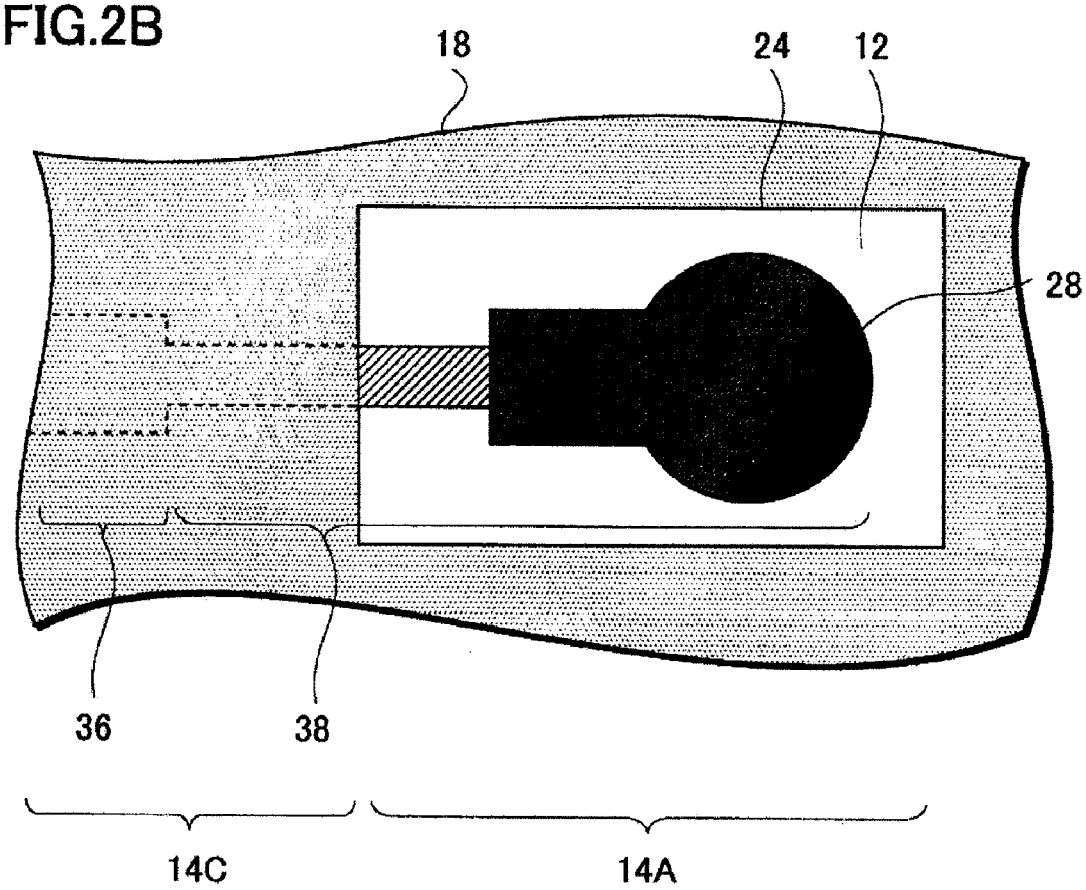
FIG. 2B is a plan view, of the circuit device according to the first preferred embodiment.
Figure 3A:
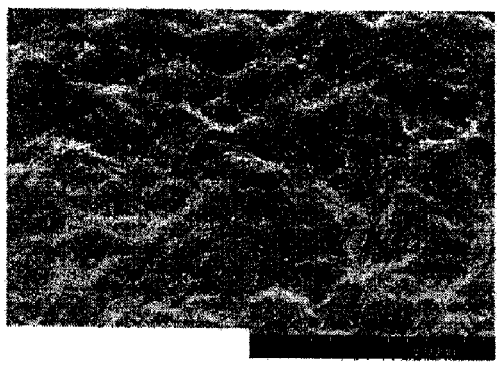
FIGS. 3A to 3C are images of one of wirings included in the circuit device according to the first preferred embodiment.
Figure 3B:
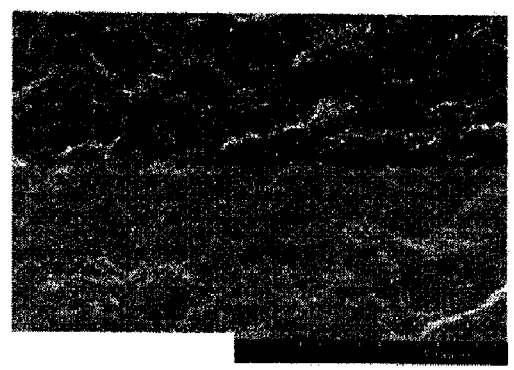
Figure 3C:
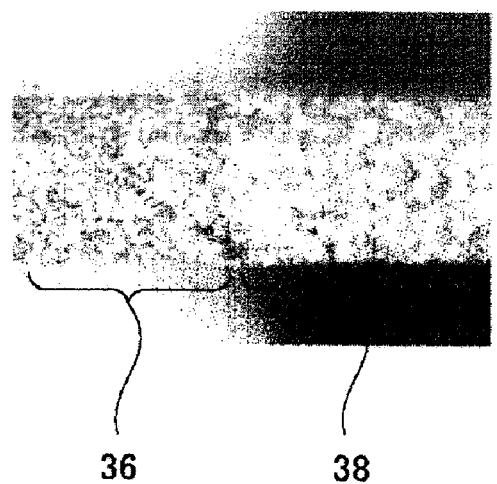
Figure 4A:
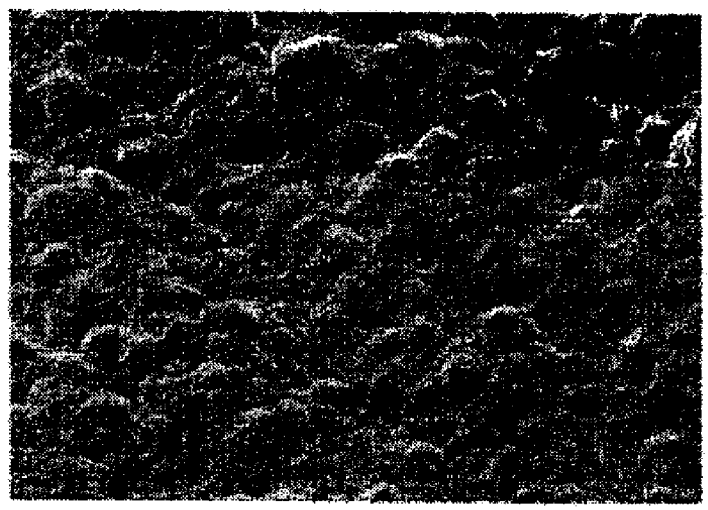
FIGS. 4A and 4B are images of one of the wirings included in the circuit device according to the first preferred embodiment.
Figure 4B:
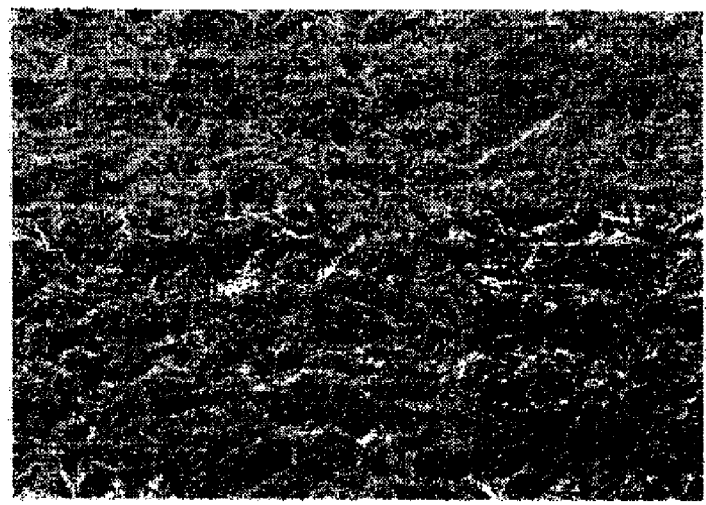
Figure 5A:
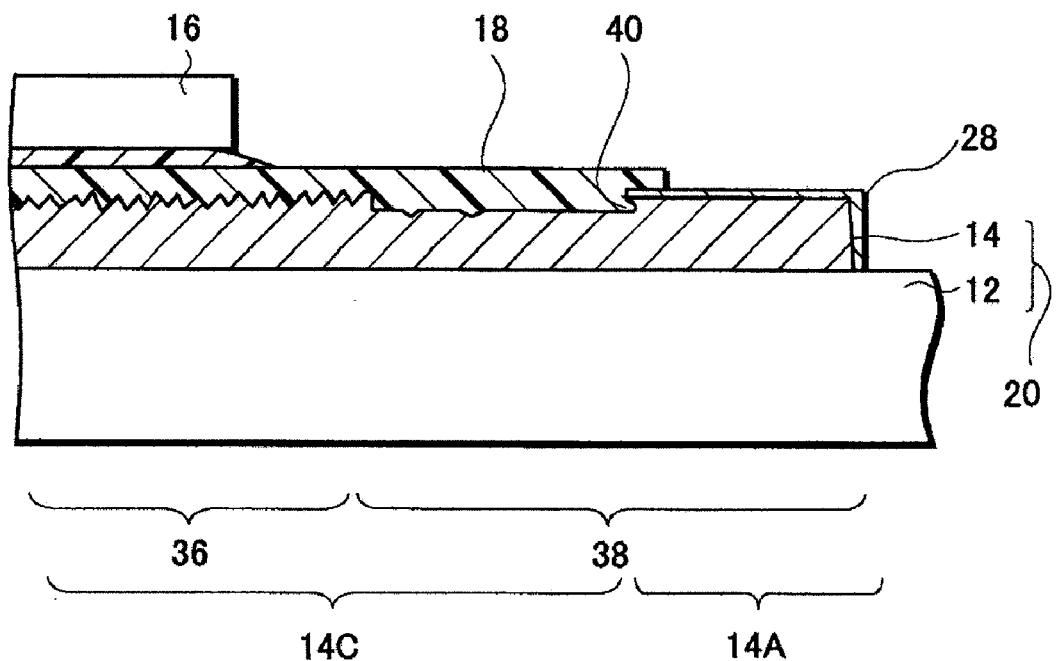
FIG. 5A is a cross-sectional view.
Figure 5B:
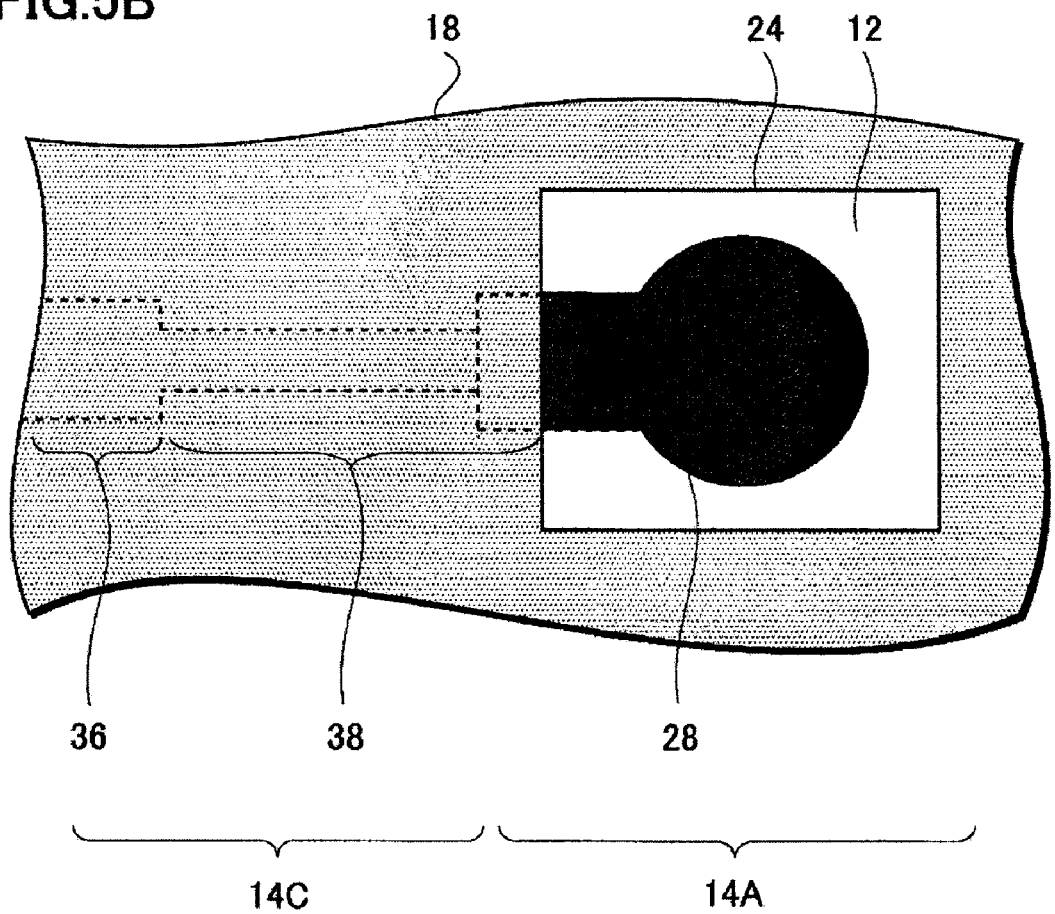
FIG. 5B is a plan view, of the circuit device according to the first preferred embodiment.

A configuration of a circuit device 10 according to a first preferred embodiment will be described below with reference to FIGS. 1A and 1B, FIGS. 2A and 2B, FIGS. 3A to 3C, FIGS. 4A and 4B, and FIGS. 5A and 5B. FIGS. 1A and 1B are views showing an overall configuration of the circuit device 10. FIGS. 2A and 2B are views showing the surface roughness of each wiring (interconnection) 14. FIGS. 3A to 3C are images showing states of surfaces of one of the wirings 14. FIGS. 4A and 4B are images respectively showing states of an wiring surface and a plated surface. FIGS. 5A and 5B are views showing another structure of the wiring 14.

Firstly, the configuration of the circuit device 10 will be described with reference to FIGS. 1A and 1B. FIG. 1A is a cross-sectional view, and FIG. 1B is a plan view, of the circuit device 10. Here, FIG. 1A is a typical cross-sectional view of the plan view shown in FIG. 1B.

The circuit device 10 is a resin-molded chip-size package (CSP), and the outside dimension of the circuit device 10 is slightly larger than that of a semiconductor element 16 included in the circuit device 10. The external appearance of the circuit device 10 is a rectangular parallelepiped shape or a cube shape. Moreover, the circuit device 10 is a ball grid array (BGA), in which connection electrodes 34 electrically connected to the semiconductor element 16 included in the circuit device 10 are disposed on the bottom surface of a circuit board 20 in a grid pattern.

It should be noted that, since the circuit device 10 may be a System in Package (SIP) or the like, the connection electrodes 34 may be disposed in a circle along the periphery of the circuit board or may be disposed in random positions.

As shown in FIG. 1A, the circuit device 10 mainly includes: the circuit board 20, having the wirings 14 disposed on the upper surface; a semiconductor element 16, adhered to the circuit board 20, and electrically connected to the wirings 14; and an sealing resin 22, covering the upper surface of the circuit board 20 so as to cover the semiconductor element 16.

The circuit board 20 includes: a substrate 12; the wirings 14, formed on the upper surface of the substrate 12; a cover layer 18, covering the wirings 14 excluding regions to serve as connectors; back electrodes 32 formed on the bottom surface of the substrate 12; and through-hole electrodes 30, penetrating the substrate 12, and connecting the wirings 14 and the back electrodes 32.

The substrate 12 is an interposer mainly made of a resin material, such as glass epoxy, which is composed of glass fibers impregnated with epoxy resin, or the like. Wiring layers are formed respectively on the upper and bottom surfaces of the substrate 12. In addition, the substrate 12 has a function of mechanically supporting the semiconductor element 16 in the manufacturing process. Materials other than the above-mentioned material mainly made of resin can also be used as the material of the substrate 12. Accordingly, an inorganic material such as ceramics or Si, or a metallic material such as copper or aluminum, can also be used as the material of the substrate 12. In the case of using a metallic material as the material of the substrate 12, the upper and bottom surfaces of the substrate 12 are each covered with an insulating layer made of resin or the like to insulate the wirings 14 and the like from the substrate 12.

The wirings 14 are made of a metal such as copper or aluminum, and are formed in predetermined shapes through the selective etching of a conductive foil with a thickness of approximately 20 μm to 50 μm stacked on the upper surface of the substrate 12. Alternatively, a plating film may be selectively adhered to form the wirings 14. A characteristic of this preferred embodiment is that, on the surfaces of each of the wirings 14, convex portions in a region around an opening 24 formed in the cover layer 18 are set larger in width than convex portions in a region outside of the region around the opening 24, and description of this characteristic is to be given later. In the first preferred embodiment, the wirings 14 are formed as a single layer on the upper surface of the substrate 12. However, multiple wiring layers of more than two layers stacked with an insulating layer interposed between each adjacent two layers may be formed on the upper or bottom surface of the substrate 12. Moreover, the structure of the circuit board is not specially limited, and may be a clad structure, in which patterns are stacked from bottom up with an insulating layer interposed between each adjacent two patterns, for example.

As shown in FIG. 1B, each of the wirings 14 includes a first connection portion 14A (connectors), a second connection portion 14B, and an wiring portion 14C having a long narrow shape provided between the connection portions. The first connection portion 14A is a portion electrically connected to the semiconductor element 16 (circuit element). In FIG. 1B, multiple aforementioned first connection portions 14A are disposed along the periphery of the circuit board 20 so as to surround the semiconductor element 16, as an example. In other words, the first connection portions 14A are disposed around the circuit-element-mounting-region in which a circuit element such as a semiconductor element is designed to be mounted.

The second connection portions 14B are portions to be connected, at the bottom surfaces, to the through-hole electrodes 30, and are positioned closer to the center of the circuit board than the first connection portions 14A. Each pair of the first connection portion 14A and the second connection portion 14B are connected by the corresponding wiring portion 14C, which is longer and narrower than the connection portions connected therewith. By use of the wirings 14 having the above-described structure, electrodes arranged closely in arrays on the upper surface of the semiconductor element 16 can be rearranged, on the bottom surface of the circuit board 20, as back electrodes 32 formed in a matrix with spaces between the electrodes.

On the bottom surface of the substrate 12, back electrodes 32 are formed through the etching of a conductive foil. Because of the above-described structure of the wirings 14, the length of each of the spaces between the back electrodes 32 is set to be longer than that of each of the spaces between the first connection portions 14A of the wirings 14.

The through-hole electrodes 30 are each formed by filling, with a metal such as copper, a through hole formed so as to penetrate the substrate 12 in the thickness direction at a predetermined position, by means of plating. As shown in FIG. 1B, the through-hole electrodes 30 and the back electrodes 32 are provided under the second connection portions 14B of the wirings 14. Here, a covering resin may be provided for covering the bottom surface of the substrate 12 and the back electrodes 32 excluding the portions on which the connection electrodes 34 are to be formed. In such a case, on the surfaces of each of the back electrodes 32 as similar to the upper-surfaces of wirings 14, convex portions in a region around an opening 24 formed in the cover layer 18 may be set larger in width than convex portions in a region outside of the region around the opening 24.

The upper surface of the substrate 12 is covered with the cover layer 18 so as to cover the wirings 14 excluding the portions to be the connectors. The cover layer 18 is made of thermosetting resin such as epoxy resin or thermoplastic resin such as polyethylene. The thickness of the cover layer 18 covering the upper surfaces of the wirings 14 is approximately 20 μm to 100 μm, for example. As shown in FIG. 1B, the openings 24 are formed in a rectangular shape by removing parts of the cover layer 18 so that the first connection portions 14A of the wirings 14 can be exposed. The cover layer 18 is also called a solder resist or a photo solder resist (PSR). It should be noted that the cover layer 18 may be formed on the bottom surface of the circuit board 20.

The semiconductor element 16 (circuit element) is adhered on the upper surface of the circuit board 20, and is electrically connected to the wirings 14. Specifically, the semiconductor element 16 is mounted on the circuit board 20 in face-up disposition, and the bottom surface of the semiconductor element 16 is adhered on the upper surface of the cover layer 18 with an insulting adhesive. In the case where the bottom surface of a semiconductor element is to be fixed to the GND, the bottom surface of the semiconductor element is fastened to an island with a conductive material such as a brazing filler metal or conductive paste. Electrodes formed on the upper surface of the semiconductor element 16 are connected to the wirings 14 through thin metallic wires 26 made of Au or the like. Although the semiconductor element 16 is mounted in face-up disposition as an example in the first preferred embodiment, the semiconductor element 16 may be mounted in face-down disposition. In such a case, the semiconductor element 16 is disposed so that the surface on which the electrodes are provided can be the bottom surface, and each of the wirings 14 formed on the upper surface of the circuit board 20 is electrically connected to the semiconductor element 16 through a bump electrode connected to the corresponding electrode on the bottom surface of the semiconductor element 16.

Although the semiconductor element 16 is used as the circuit element included in the circuit device 10 in the first preferred embodiment, a circuit element of a different type may be used, instead. Specifically, an active element, such as an integrated circuit (IC), a large scale integration (LSI), a discrete transistor or a diode, may be used as the circuit element. Moreover, a passive element, such as a chip resistor, a chip capacitor or a sensor, may be used as the circuit element. Alternatively, a system including multiple passive elements and multiple active elements that are combined to be interconnected may be built in the inside of the circuit device 10 (i.e. SIP: System in Package). In this case, as shown in FIG. 1A, passive elements such as chip resistors are provided next to the semiconductor element 16, and the wirings 14 having the above-described structure are formed in the region under and around the semiconductor element 16.

The circuit board having the above-described structure can be used in a module simply placing a circuit element on a circuit board and a circuit device in which the entire circuit board is molded. As a circuit element to be placed on the circuit board or the circuit device, a semiconductor chip or a passive element can be used. In such a case, circuit elements are provided three-dimensionally or in a plane. In other words, multiple semiconductor chips may be stacked to form a three-dimensional structure, or multiple semiconductor chips may be disposed in a plane. In either case, multiple circuit elements are provided to form a system.

The sealing resin 22 is made of thermosetting resin formed by means of transfer mold, or of thermoplastic resin formed by means of injection mold. The sealing resin 22 is formed to cover the semiconductor element 16, the thin metallic wires 26 and the upper surface of the circuit board 20. Moreover, the sealing resin 22 is in contact with the upper surface of the substrate 12, the upper surface of the cover layer 18, wirings 14 and plating films 28.

The configuration of the circuit device 10 will be described further with reference to FIG. 1B. In FIG. 1B, the thin metallic wires 26 connecting the semiconductor element 16 and the wirings 14 are omitted.

Firstly, the single semiconductor element 16 is mounted on an approximately center portion of the circuit board 20. The multiple first connection portions 14A of the wirings 14 are disposed to surround the semiconductor element 16. The first connection portions 14A are provided so as to correspond with the electrodes disposed on the upper surface of the semiconductor element 16.

The approximately entire upper surface of the circuit board 20 is covered with the cover layer 18, while parts of the cover layer 18 are removed to form rectangular-shaped openings 24 so that the first connection portions 14A of the wirings 14 can be exposed. From each of the openings 24, exposed are the corresponding first connection portions 14A of the wirings 14, the plating film 28 covering the first connection portion 14A, and the upper surface, around the first connection portion 14A, of the substrate 12.

The multiple wirings 14 are provided on the upper surface of the substrate 12, and are each radially extended from under the semiconductor element 16 (the approximately center portion of the circuit board 20) toward the periphery of the circuit board 20. The second connection portions 14B are each formed in a position closer to the center of the circuit board 20 than the corresponding first connection portion 14A, and the bottom surfaces of the second connection portions 14B are connected to the through-hole electrodes 30, respectively. The large number of second connection portions 14B can be classified into two types, those disposed under the semiconductor element 16 and those disposed in the region outside the semiconductor element 16. However, all the second connection portions 14B may be disposed under the semiconductor element 16.

Next, the surface roughness of surfaces of the wirings 14 will be described with reference to FIGS. 2A and 2B. FIG. 2A is a cross-sectional view, and FIG. 2B is a plan view, showing the first connection portion 14A of each of the wirings 14 and the portions around the first connection portion 14A. Here, FIG. 2A is a typical cross-sectional view of the plan view shown in FIG. 2B.

On the surfaces of each of the wirings 14 according to the first preferred embodiment, the convex portions in a region around an opening 24 formed in the cover layer 18 are set larger in width than the convex portions in a region outside of the region around the opening 24. To put it another way, on the surfaces of each of the wirings 14, the widths of the convex portions in the region outside of the region around the opening 24 are smaller than those of the convex portions in the region around the opening 24. With this configuration, adhesion reliability between the wirings 14 and the cover layer 18 covering the wirings 14 under a thermal cycle load can be enhanced. In other words, exfoliation of the cover layer 18 from the wiring 14 can be prevented. Here, the surfaces of each wiring 14 means the upper and side surfaces of the wiring 14, and these surfaces are covered with the cover layer 18.

As shown in FIG. 2A, each wiring 14 is formed on the upper surface of the substrate 12, and the cover layer 18 is formed so as to cover the wiring 14. Moreover, the semiconductor element 16 is adhered to the upper surface of the cover layer 18. In FIG. 2A, the first connection portion 14A and the wiring portion 14C of the wiring 14 are shown, and the wiring portion 14C is covered with the cover layer 18 while the first connection portion 14A is exposed without being covered with the cover layer 18. Instead, the upper and side surfaces of the first connection portion 14A are covered with the plating film 28. As the plating film 28, a film including, for example, a nickel (Ni) film and a gold (Au) film formed sequentially is used. Although not shown in FIG. 2A, an end of each thin metallic wire 26 is connected to the upper surface of the corresponding plating film 28, and the other end of the thin metallic wire 26 is connected to the corresponding electrode provided on the upper surface of the semiconductor element 16.

Each wiring 14 can be divided into two regions: a first rough region 36, in which the widths of convex portions on the surfaces are relatively small; and a second rough region 38, in which the widths of convex portions on the surfaces are larger than those of the first rough region 36. The widths of the convex portions of the first rough region 36 and the second rough region 38 can be adjusted by appropriately selecting the etchant used for the etching of the surfaces. Here, the width of a concave portion means the width of the bottom of the concave portion.

The first rough region 36 corresponds to the region, of the wiring 14, from a middle of the wiring portion 14C to the inner side on the circuit board 20 (to the left side in FIG. 2B), and thus includes part of the wiring portion 14C and the second connection portion 14B (see FIG. 1B). On the surfaces in the first rough region 36, relatively fine convex portions are formed, and the size of each of the convex portions is approximately 1.2 μm in height and 1.7 μm in width, for example. Accordingly, in the first rough region 36, anchor effect occurs between the cover layer 18 and the surfaces of the wiring 14 having sharp convexes and concaves, and hence, the adhesion strength between the wiring 14 and the cover layer 18 increases. Moreover, by forming sharp convexes and concaves on the surfaces in the first rough region 36, the surface area of the wiring 14 in this region increases, and the area where the wiring 14 and the cover layer 18 adhere to each other consequently increases. This also contributes to increase in the adhesion strength between the wiring 14 and the cover layer 18 in the first rough region 36.

The second rough region 38 corresponds to the region, of the wiring 14, from the middle of the wiring 14C to the outer side on the circuit board 20 (to the right side in FIG. 2B), and thus includes part of the wiring portion 14C and the first connection portion 14A (see FIG. 1B). On the surfaces in the second rough region 38, the widths of convex portions are larger than those in the first rough region 36. Specifically, the size of each convex portion formed on the surfaces in the second rough region 38 is approximately 0.8 μm in height and 2.4 μm in width, for example. Thus, the convex portions on the surfaces in the second rough region 38 each have a shape larger in width than those in the first rough region 36.

By forming the surfaces of the wiring 14 in the second rough region 38 to have the above-described structure, exfoliation of the cover layer 18 from the wiring 14 in the second rough region 38 can be prevented. Specifically, since thermal expansion coefficient of the cover layer 18 made of resin is different from that of the wiring 14 made of a metallic material, thermal stress occurs at the interface between the cover layer 18 and the wiring 14 when the temperature changes. This thermal stress acts along and in parallel with the interface between the upper surface of the wiring 14 and the cover layer 18. Moreover, the thermal stress is relatively small in the center portion of the circuit board 20 while being relatively large in the region around the openings 24 of the cover layer 18 (see FIGS. 1A and 1B). In other words, since the openings 24 are formed in the periphery of the circuit board 20 in the first preferred embodiment, thermal stress is large in the periphery of the circuit board 20. Accordingly, most exfoliation of the cover layer 18 from the wirings 14 attributable to thermal stress occurs around the openings 24 of the cover layer 18, that is, in the periphery of the circuit board 20.

In the first preferred embodiment, the portions, of the wirings 14, positioned in the periphery of the circuit board 20 are each set to be the second rough region 38 as described above. Here, since the convex portions on the surfaces of each of the wirings 14 are large in width in second rough region 38, no sharp shape to which thermal stress is likely to concentrate is included on the surfaces in the second rough region 38. This prevents thermal stress from concentrating in the periphery of the circuit board 20, and thereby prevents exfoliation of the cover layer 18 from the wirings 14 in the periphery of the circuit board 20.

In the center portion of the circuit board 20, by contrast, convex portions each having a sharp shape with a small width to have large anchor effect are formed on the surfaces of the wirings 14. Consequently, large anchor effect occurs between the cover layer 18 and the first rough region 36 of each of the wirings 14, and hence, exfoliation of the cover layer 18 from the wirings 14 can be prevented.

As described above, in the first preferred embodiment, exfoliation of the cover layer 18 from the wirings 14 can be prevented even when large thermal stress acts at the interface between the cover layer 18 and the wirings 14, by causing the convex portions on the surfaces of each of the wirings 14 in the center portion of the circuit board 20 to have a width different from those in the periphery of the circuit board 20.

Furthermore, according to the first preferred embodiment, the following effect can also be brought about. To reduce circuit devices in size and weight, it is required to improve the packaging density of patterns by reducing the widths of wirings provided on the circuit board and the lengths between the wirings. In other words, the widths of wirings need to be set smaller. However, if the surface roughness of the entire region of each of the wirings is in the state of a rough region, the thermal expansion coefficient of the wirings is not consistent with that of the cover layer or the sealing resin provided above the cover layer. Accordingly, stress shown in FIG. 18B is applied, and voids are formed especially in the root (neck) of a terminal consequently, which may cause an increase in the electrical resistance.

The formation of voids is attributed to the fact that the stress concentrates in the root, so that defects in the wirings concentrate in the root. However, as shown in FIGS. 2A and 2B, the second rough region 38 is partly formed on surfaces of the wirings 14. Thus, the surfaces of the wirings 14 are made to have shapes that can avoid stress concentration. Thereby, the formation of voids can be prevented, and reliability can be enhanced accordingly.

Next, each of the regions of the wirings 14 will be described with reference to the images shown in FIGS. 3A to 3C. FIG. 3A is an image showing a surface in the first rough region 36 of one of the wirings 14, FIG. 3B is an image showing a surface in the second rough region 38 of the wiring 14, and FIG. 3C is an image showing the surfaces in both the first rough region 36 and the second rough region 38.

By comparing the first rough region 36 and the second rough region 38 of the wiring 14 with reference to FIGS. 3A and 3B, the convexo-concave degree (degree of roughness) of the surface is larger in the first rough region 36 than in the second rough region 38. In other words, the convex portions formed in the first rough region 36 are larger in height and smaller in width than those in the second rough region 38. By forming the surfaces in the first rough region 36 and the surfaces in the second rough region 38 with different degrees of surface roughness in this way, the above-described effects can be obtained. Such a surface structure can be formed by performing etching in the first rough region 36 and the second rough region 38 respectively with etchants having different properties. Detailed description of the formation of this structure will be given later.

In FIG. 3C, the left side of the wiring shown in this image is the first rough region 36, and the right side thereof is the second rough region 38. From the image in FIG. 3C, it is obvious that the degree of roughness in the first rough region 36 is different from that in the second rough region 38 to the extent that the boundary between the two regions can be seen clearly.

Moreover, as shown in FIG. 2B, the second rough region 38 (a conductive material) of the wiring 14 as well as the plating film 28 are exposed from the opening 24 that is formed by removing part of the cover layer 18. The plating film 28 and the second rough region 38 exposed from the opening 24 are covered with the sealing resin 22 (see FIG. 1A). This means that the cover layer 18 only covers the wiring 14, and does not cover the plating film 28. With this configuration, the adhesion strength between the sealing resin 22 and the wiring 14 can be increased. Specifically, since the surface of the plating film 28 is extremely smooth because of its outermost surface made of gold, the adhesion strength between the plating film 28 and the sealing resin 22 is low. However, the second rough region 38 of the wiring 14 exposed from the opening 24 has a rough surface compared to the surface of the plating film 28. Accordingly, the adhesion strength between the second rough region 38 and the sealing resin 22 is higher. This firm adhesion of the second rough region 38 and the sealing resin 22 can contribute to the effect of reinforcement on the adhesion strength between the wiring 14 and the sealing resin 22.

FIG. 4A is an image showing a surface of one of the plating films 28, and FIG. 4B is an image showing a typical surface of the wirings 14. From FIGS. 4A and 4B, it is obvious that the surface of the wiring 14 is rougher than that of the plating film 28. Hence with the above-described configuration, the adhesion strength between the sealing resin 22 and other portions (the wirings 14, here) can be increased.

Next, another related configuration of the wirings 14 and the cover layer 18 will be described with reference to FIGS. 5A and 5B. FIG. 5A is a cross-sectional view, and FIG. 5B is a plan view, showing the first connection portion 14A of each of the wirings 14 and the portions around the first connection portion 14A.

The configuration shown in FIGS. 5A and 5B is basically same as that described with reference to FIGS. 2A and 2B. The difference between the two configurations is that part of the surfaces of the wiring 14 and part of the surface of the plating film 28 are covered with the cover layer 18.

As shown in FIG. 5A, the cover layer 18 covers part of the plating film 28 as well as the second connection portion 14B that is not shown in FIG. 5A, the wiring portion 14C and part of the first connection portion 14A. In other words, the entire surface, of the wiring 14, not covered with the plating film 28 is covered with the cover layer 18.

As shown in FIG. 5B, only the plating film 28 covering the first connection portion 14A is exposed from the opening 24 that is formed by removing part of the cover layer 18, and the wiring 14 itself is not externally exposed.

With this configuration, since the wiring 14 is not externally exposed, oxidization of the surfaces of the wiring 14 can be prevented. In addition, although the second rough region 38 is formed extremely narrow compared to the other region, this region is also covered with the cover layer 18. Accordingly, the breaking of the second rough region 38 can be prevented. Specifically, the width of the second rough region 38 is approximately 35 µm, for example, while the width of the other region (first rough region 36) of the wiring 14 is approximately 45 µm, for example. The reason why the second rough region 38 has a narrow width is that this region is subjected to etching several times. This will be obvious from the description of a manufacturing method to be given later.

Moreover, as shown in FIG. 5A, moisture resistance of the entire device can be enhanced by covering, with the cover layer 18, the wiring 14 together with part of the plating film 28. Specifically, not only the surfaces of both the wiring 14 and the part of the plating film 28 but also the stepped portion, which is the boundary between the wiring 14 and the plating film 28, are covered with the cover layer 18. With this configuration, the line of the interface between the cover layer 18 and the wiring 14, which are made of different materials, is set to be long, and the moisture resistance is enhanced accordingly.

Furthermore, as shown in FIG. 5A, a recessed portion 40 recessed toward the inside is formed in a region, of the wiring 14, corresponding to the end portion of the plating film 28. Specifically, after the plating film 28 is adhered to the first connection portion 14 of the wiring 14, light wet etching is performed on the entire wiring 14. Since wet etching progresses isotropically, the etching progresses toward the side of the plating film 28 (to the right side in FIG. 5A) to form the recessed portion 40, around the end portion of the plating film 28. Accordingly, the end portion of the plating film 28 extends like a peaked roof. The recessed portion 40 is filled up with the resin material forming the cover layer 18, and is formed along the end portion of the plating film 28 formed on the upper and side surfaces of the wiring 14. With this configuration, the line of the interface between the surfaces of the wiring 14 and the cover layer 18 is set to be long, and the moisture resistance is further enhanced.

Second Preferred Embodiment

In the second preferred embodiment, a manufacturing method of the circuit device 10 having the above-described configuration will be described with reference to FIGS. 6A and 6B, FIGS. 7A and 7B, FIG. 8, FIGS. 9A and 9B, FIGS. 10A and 10B, FIGS. 11A and 11B, FIGS. 12A and 12B, FIGS. 13A and 13B, FIGS. 14A and 14B, and FIGS. 15A and 15B. FIGS. 6A, 7A, 9A, 10A, 11A, 12A, 13A, 14A and 15A are cross-sectional views, and FIGS. 6B, 7B, 9B, 10B, 11B, 12B, 13B, 14B and 15B are plan views.

Figure 6A:
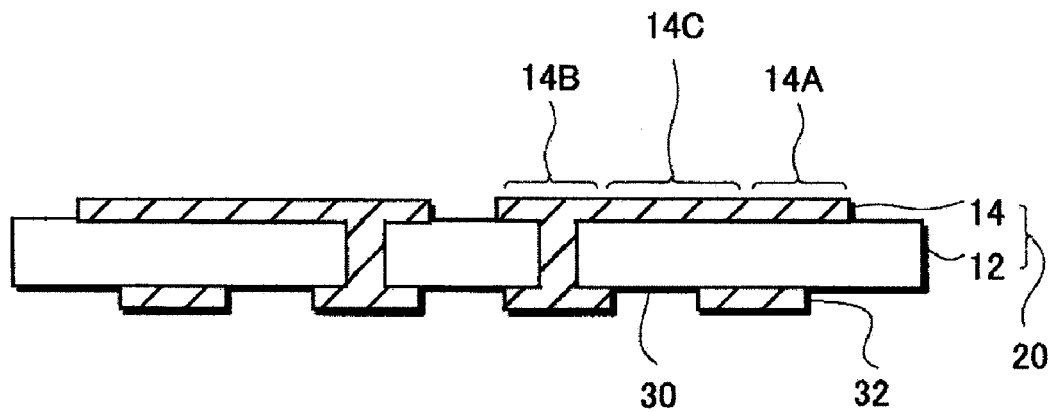
FIG. 6A is a cross-sectional view.
Figure 6B:
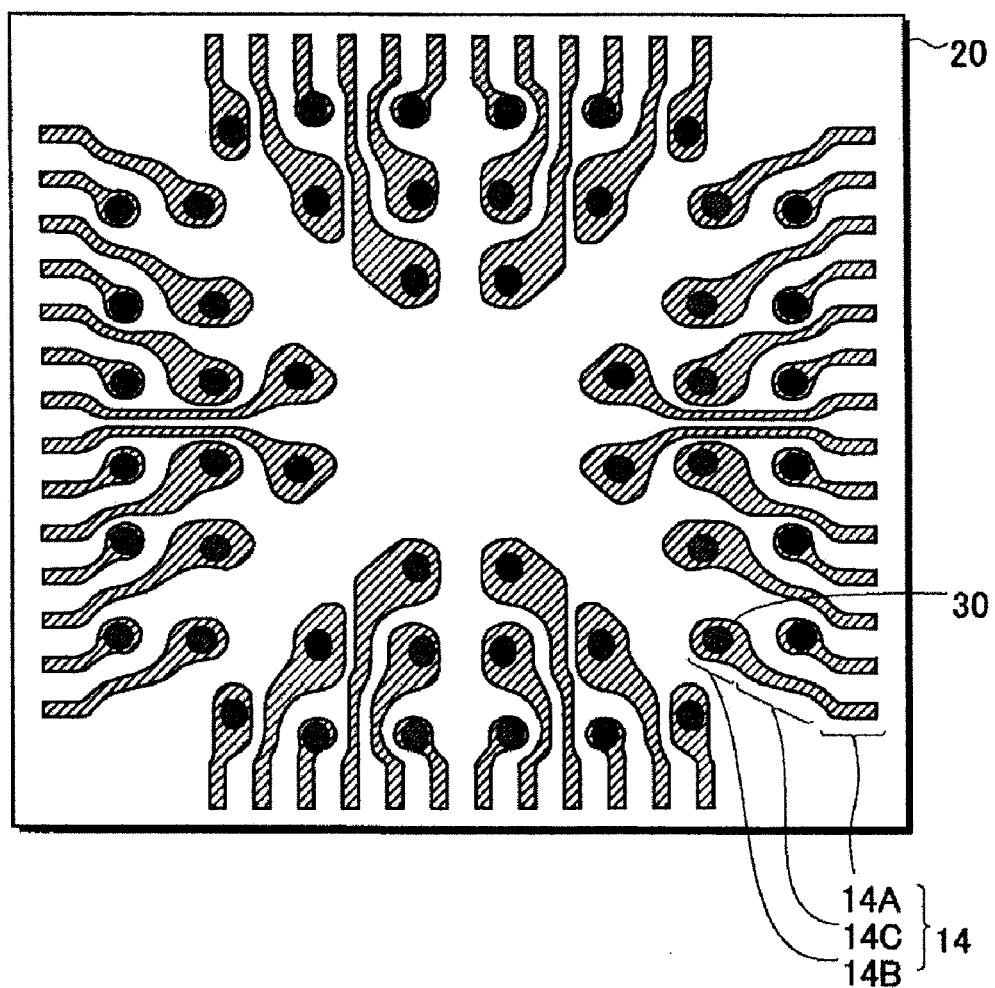
FIG. 6B is a plan view, for illustrating a manufacturing method of the circuit device according to a second preferred embodiment.

As shown in FIGS. 6A and 6B, firstly, a circuit board 20 with wirings and the like are formed on the main surface of a substrate is provided. FIG. 6A is a cross-sectional view showing the circuit board 20 in this step, and FIG. 6B is a plan view of the circuit board 20 seen from the above.

As shown in FIG. 6A, wirings 14 each having a predetermined shape are formed on the upper surface of the substrate 12, and back electrodes 32 are formed on the bottom surface of the substrate 12. In addition, through-hole electrodes 30 each connecting the corresponding wiring 14 and back electrode 32 are formed so as to penetrate the substrate 12.

The material and the like of the substrate 12 are similar to those in the aforementioned first preferred embodiment, and thus the substrate 12 is made of a resin material, an inorganic material or a metallic material. The substrate 12 is provided with the wirings 14 formed on the upper surface and the back electrodes 32 formed on the bottom surface, and, at the same time, has a function of mechanically supporting a semiconductor element 16 in the manufacturing steps.

The wirings 14 are made of metal such as copper or aluminum, and are formed through the selective etching of a conductive foil with a thickness of 20 µm to 50 µm adhered on the upper surface of the substrate 12. Here, each of the wirings 14 includes a first connection portion 14A, a second connection portion 14B, and an wiring portion 14C, which is provided between the connection portions in a narrow shape. As shown in FIG. 6B, the multiple wirings 14 are provided on the upper surface of the substrate 12, and are each radially extended from an approximately center portion toward the periphery of the circuit board 20. As a planar configuration, the multiple first connection portions 14A are disposed in arrays along and in parallel with the side edges of the circuit board 20. In addition, the second connection portions 14B are each formed in a position closer to the center of the circuit board 20 than the corresponding first connection portions 14A. To the bottoms of the second connection portions 14B, through-hole electrodes 30 are respectively connected.

The back electrodes 32 are each formed in a predetermined shape through the etching of a conductive foil adhered to the bottom surface of the substrate 12, as in the case of the wirings 14. As shown in FIG. 6B, the back electrodes 32 are provided on the bottom surface of the circuit board 20 in a grid pattern with approximately equal spaces therebetween.

The through-hole electrodes 30 are each formed by filling, with a metal such as copper, a through-hole formed so as to penetrate the substrate 12 in the thickness direction at a predetermined position, by means of plating.

Figure 7A:
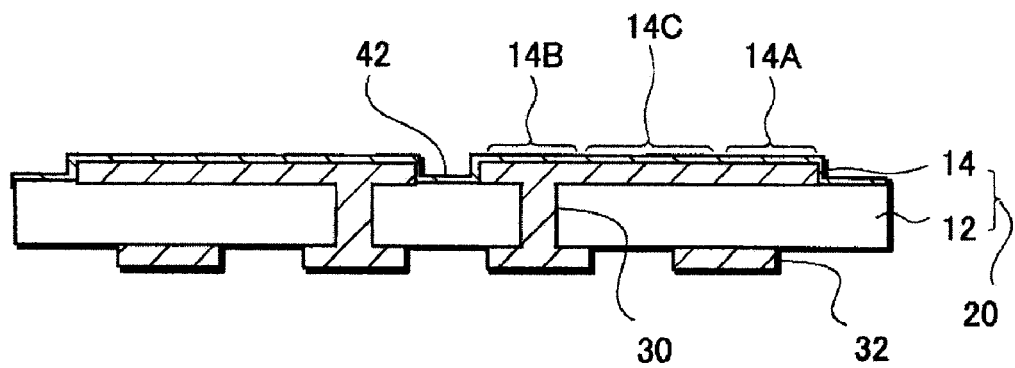
FIG. 7A is a cross-sectional view.
Figure 7B:
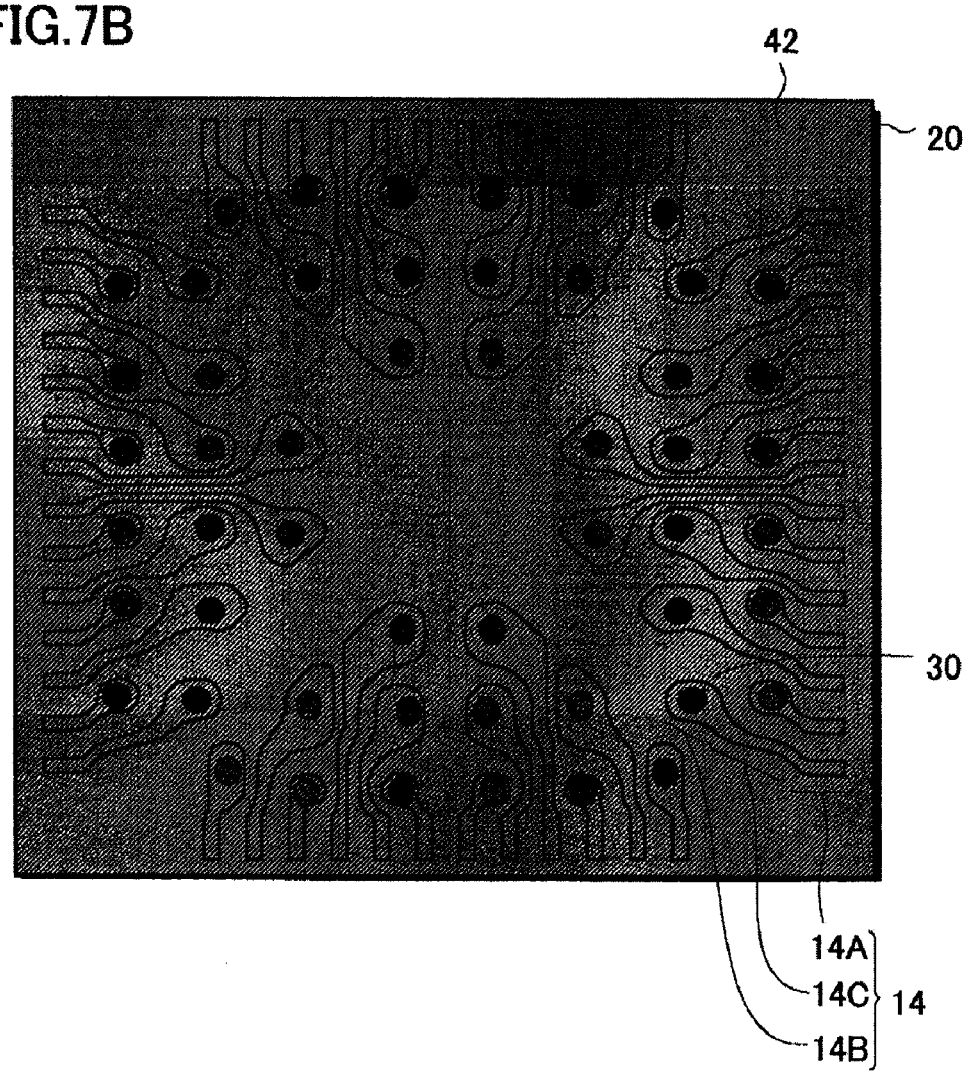
FIG. 7B is a plan view, for illustrating the manufacturing method of the circuit device according to the second preferred embodiment.

Next, as shown in FIGS. 7A and 7B, an electroless plating film 42 is adhered to the upper surface of the substrate 12 and surfaces of the wirings 14.

As shown in FIGS. 7A and 7B, in this step, the electroless plating film 42 with a thickness of, for example, approximately 1 µm is adhered to the upper surface of the substrate 12 and the surfaces (the upper and both side surfaces) of the wirings 14, by means of electroless plating. The electroless plating film 42 is adhered to both the surfaces of the wirings 14 made of a conductive material and the upper surface of the substrate 12 made of an insulating material. The material of the electroless plating film 42 may be the same (such as copper) as the wirings 14, or may be a different metallic material.

With the electroless plating film 42 formed in this step, all the wirings 14 formed on the upper surface of the circuit board 20 are short-circuited. In a later step of forming an electroplating film, the electroless plating film 42 functions like tinned wires for power supply.

Figure 8:
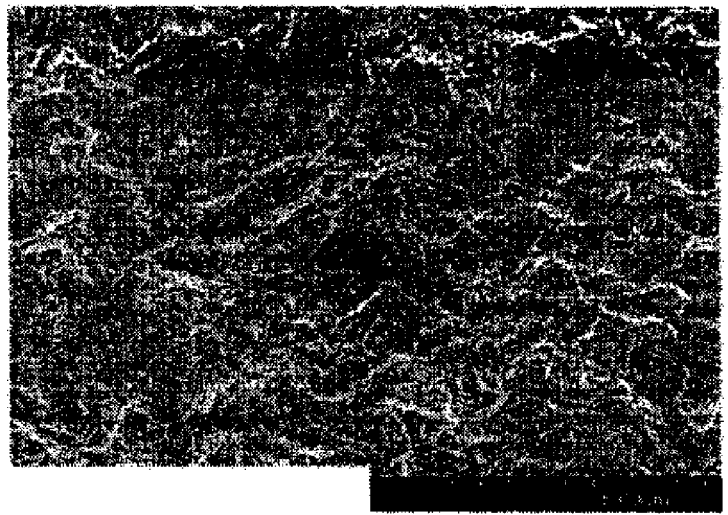
FIG. 8 is an image of a surface of an electroplating film for illustrating the manufacturing method of the circuit device according to the second preferred embodiment.

FIG. 8 is an image showing the electroless plating film 42 formed in this step. As is clear from FIG. 8, the convex portions on a surface of the electroless plating film 42 are finer than those on the surfaces in the first rough region 36 (see FIG. 3A) and on the surfaces in the second rough region 38 (see FIG. 3B). Since the convex portions in the second rough region 38 are formed by firstly etching to smooth the surface of the electroless plating film 42 shown in FIG. 8 and then roughening the surface again, the convex portions on the surfaces in the second rough region 38 are larger in width than those on the surface of the electroless plating film 42.

Figure 9A:
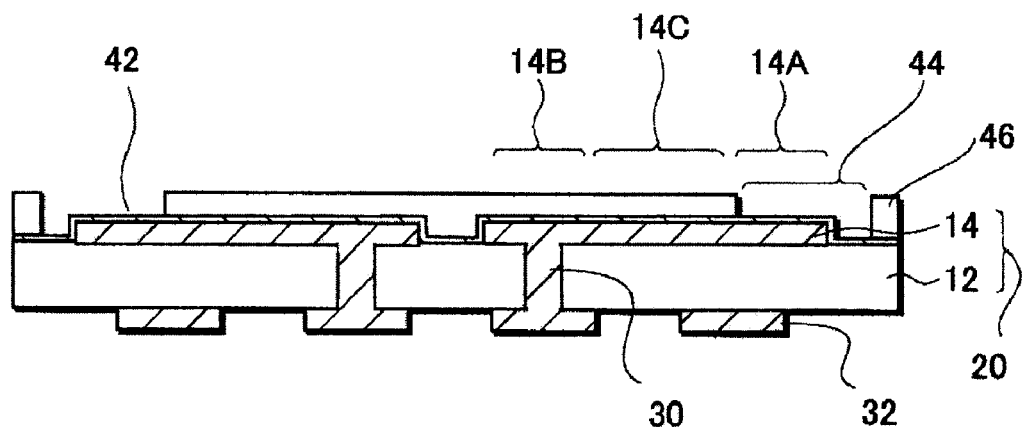
FIG. 9A is a cross-sectional view.
Figure 9B:
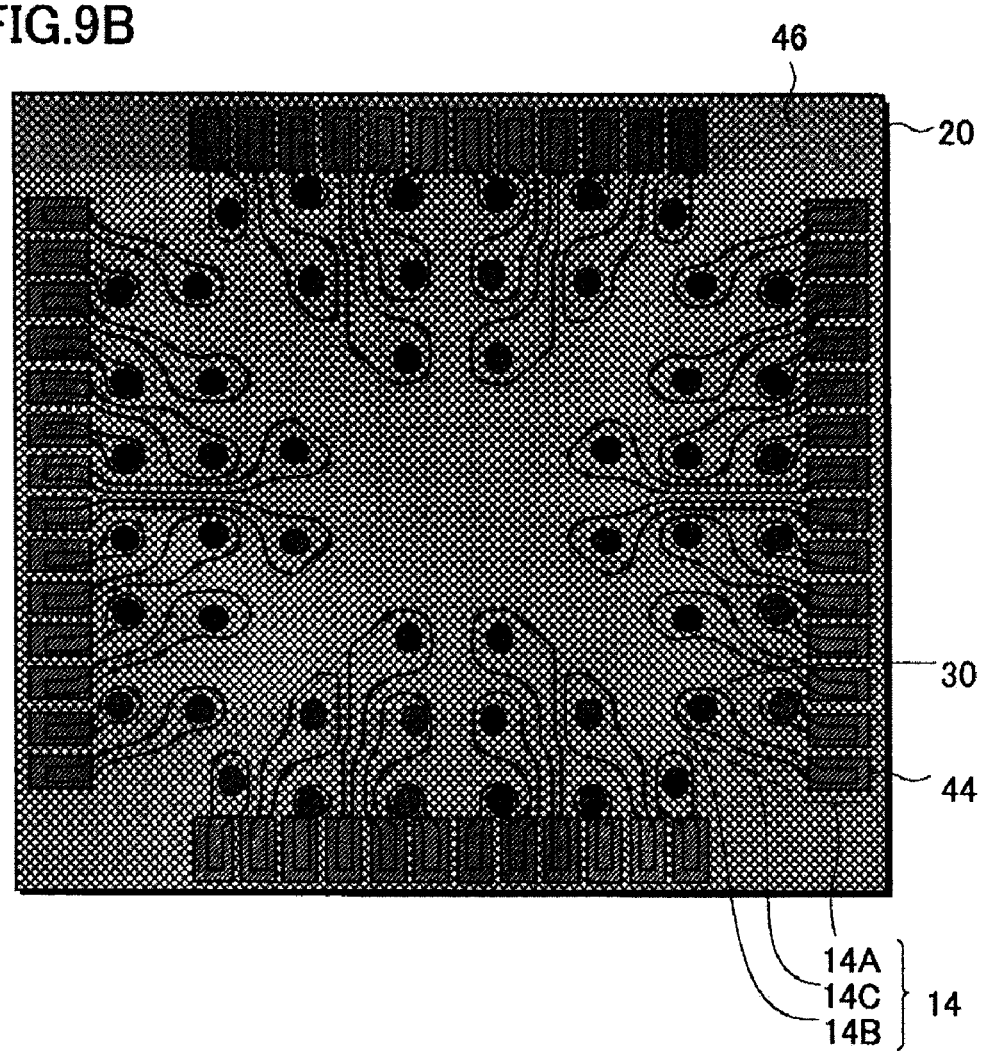
FIG. 9B is a plan view, for illustrating the manufacturing method of the circuit device according to the second preferred embodiment.

Next, as shown in FIGS. 9A and 9B, the upper surface of the circuit board 20, on which the electroless plating film 42 is formed, is covered with an etching resist 46. In this step, firstly, the thin etching resist 46, made of a resin material, is formed on the substrate 12. Thereby, the surface of the electroless plating film 42 covering the substrate 12 and the wirings 14 are entirely covered with the etching resist 46.

Then, after the photosensitive etching resist 46 is selectively irradiated with light from the above, the etching resist 46 is caused to be in contact with strong alkali solution. Thereby, parts of the etching resist that are not exposed to the light are removed so that openings 44 can be formed.

As shown in FIG. 9B, from each of the openings 44 formed by means of the above method, the first connection portion 14A of the corresponding wiring 14 and part of the upper surface of the substrate 12 around the first connection portion 14A are exposed. Here, the portions exposed from the openings 44 are entirely covered with the electroless plating film 42.

Figure 10A:
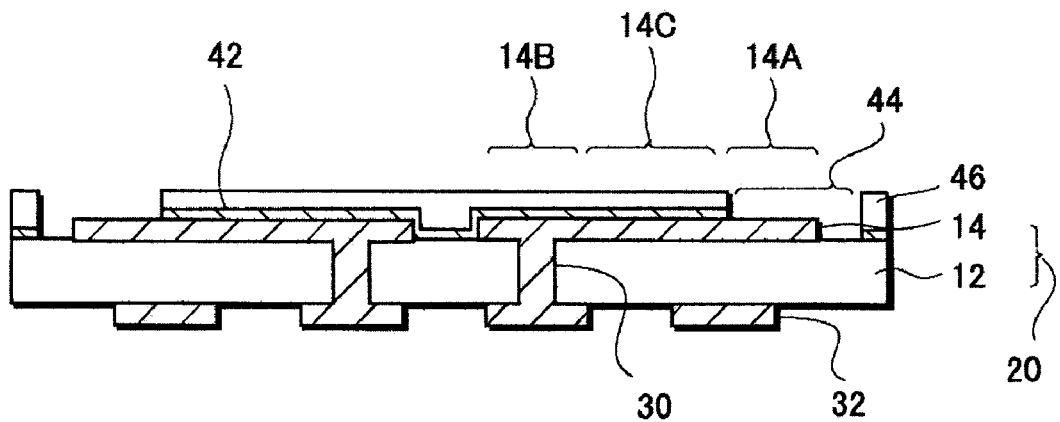
FIG. 10A is a cross-sectional view.
Figure 10B:
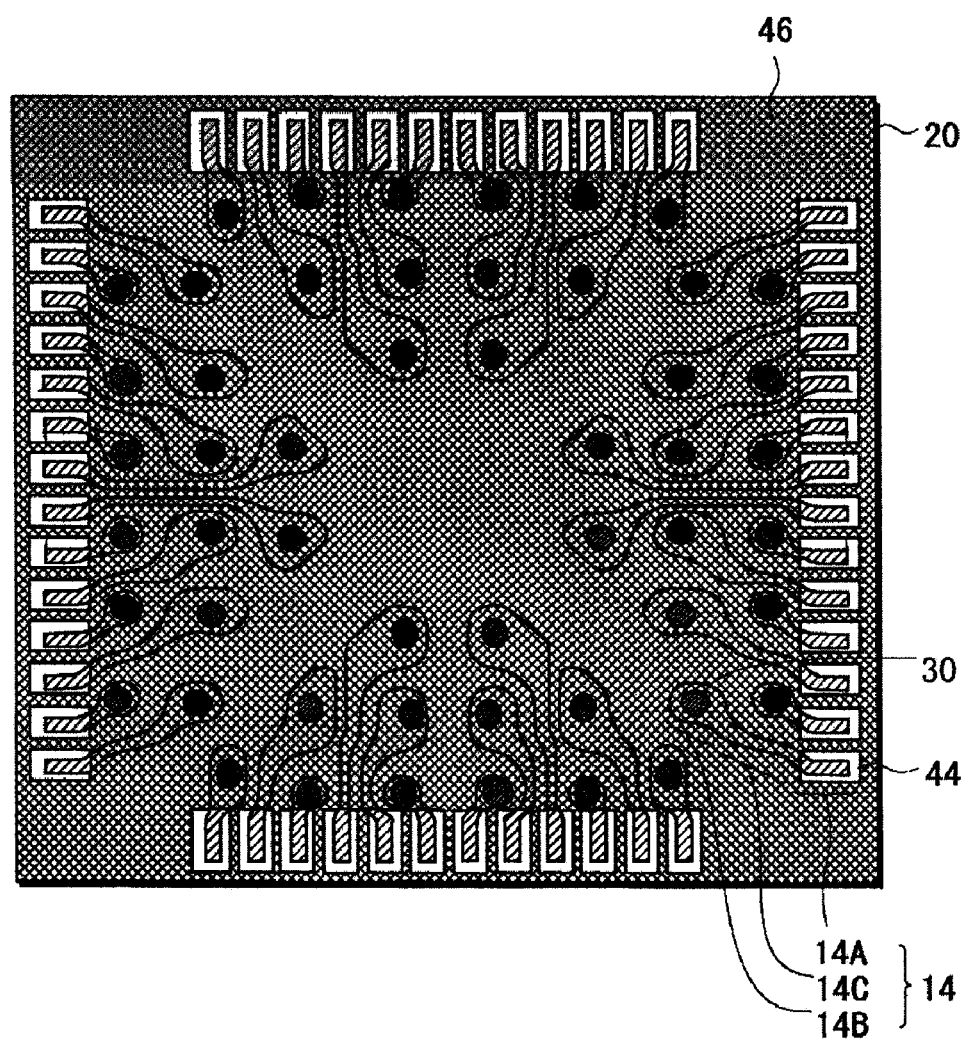
FIG. 10B is a plan view, for illustrating the manufacturing method of the circuit device according to the second preferred embodiment.

Next, as shown in FIGS. 10A and 10B, etching is performed from the openings 44 of the etching resist 46 to remove parts of the electroless plating film 42 that are exposed from the openings 44.

In this step, wet etching is performed from the openings 44 formed by removing the etching resist 46. Thereby, the parts of the electroless plating film 42 that are exposed from the openings 44 are removed through etching. In this step, etching is performed within the openings 44 until the exposed portions of the electroless plating film 42 covering the upper surface of the substrate 12 are removed.

As shown in FIG. 10B, the electroless plating film 42 covering the upper surface of the substrate 12 are removed within the openings 44 of the etching resist 46. In addition, etching is also performed on the surfaces, exposed from the openings 44, of the first connection portions 14A of the wirings 14, in this step.

An object of the etching performed in this step is to enable a plating film to adhere to only the surfaces of the first connection portions 14A without adhering to the upper surface of the substrate 12 in the next step of performing an electroplating process. If a gold-plating film, for example, is adhered to the upper surface of the substrate 12 in the next step, the parts, to which the gold-plating film is adhered, of the electroless plating film 42 may possibly remain without being removed. If the electroless plating film 42, which is not necessary to be included in a product, remains, the remaining electroless plating film 42 may cause the wirings 14 to be short-circuited. In the second preferred embodiment, to avoid such a possibility, parts of the electroless plating film 42 that cover the upper surface, around the first connection portions 14A, of the substrate 12 are removed through etching from the openings 44.

Moreover, if the material of the wirings 14 is copper, etching is performed in this step by using an etchant that causes a great difference between the etching rates of wiring copper (material of the wirings 14: such as a rolled copper foil or electrolytic copper) and electroless copper (the electroless plating film 42). In other words, etching is performed in this step by using an etchant that is more suitable for the etching of the electroless plating film 42 than that of the wirings 14.

As described above, etching is performed on the surfaces, exposed from the openings 44, of the first connection portions of the wirings 14 (the electroless plating film 42 covering the surfaces of the first connection portions 14A) in this step. In other words, wet etching is performed on the surfaces, positioned in the periphery of the circuit board 20, of the wirings 14. Thus, in this step, the surfaces, positioned in the periphery, of the wirings 14 are etched and thus planarized. Thereby, the regions, affected by this etching of this step, of the wirings 14 are made to be the second rough regions 38 shown in the drawings such as FIG. 2A.

In this step, etching is performed by using an etchant suitable for planarization. Specifically, in this step, used is an etchant capable of evenly (equally) removing all types of regions exposed in the surfaces of the wirings 14, that are surfaces of crystals forming the wirings 14 and the boundaries between the crystals (grain boundaries). As a result, the surfaces of the first connection portions 14A of the wirings 14 on which an etching process is performed in this step is made smoother. More specifically, an etchant mainly containing a ferric chloride solution is used in this step.

After the completion of this step, the etching resist 46 is exfoliated to be removed from the circuit board 20.

Figure 11A:
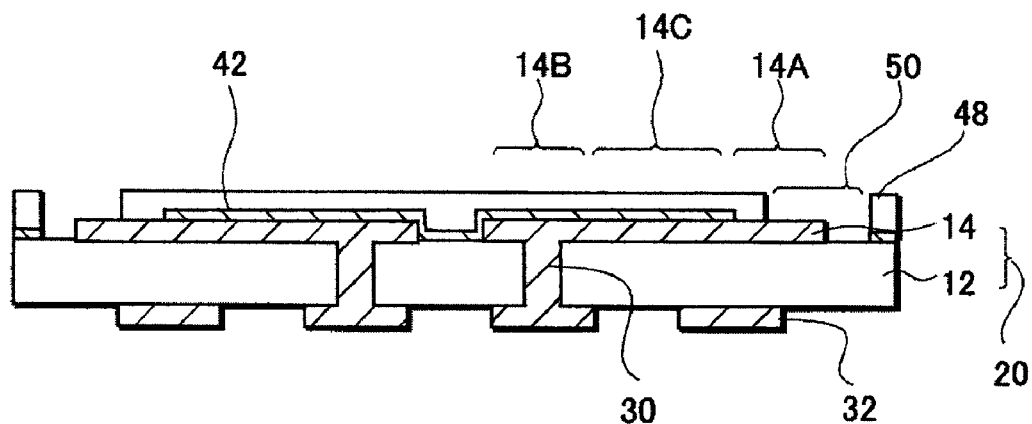
FIG. 11A is a cross-sectional view.
Figure 11B:
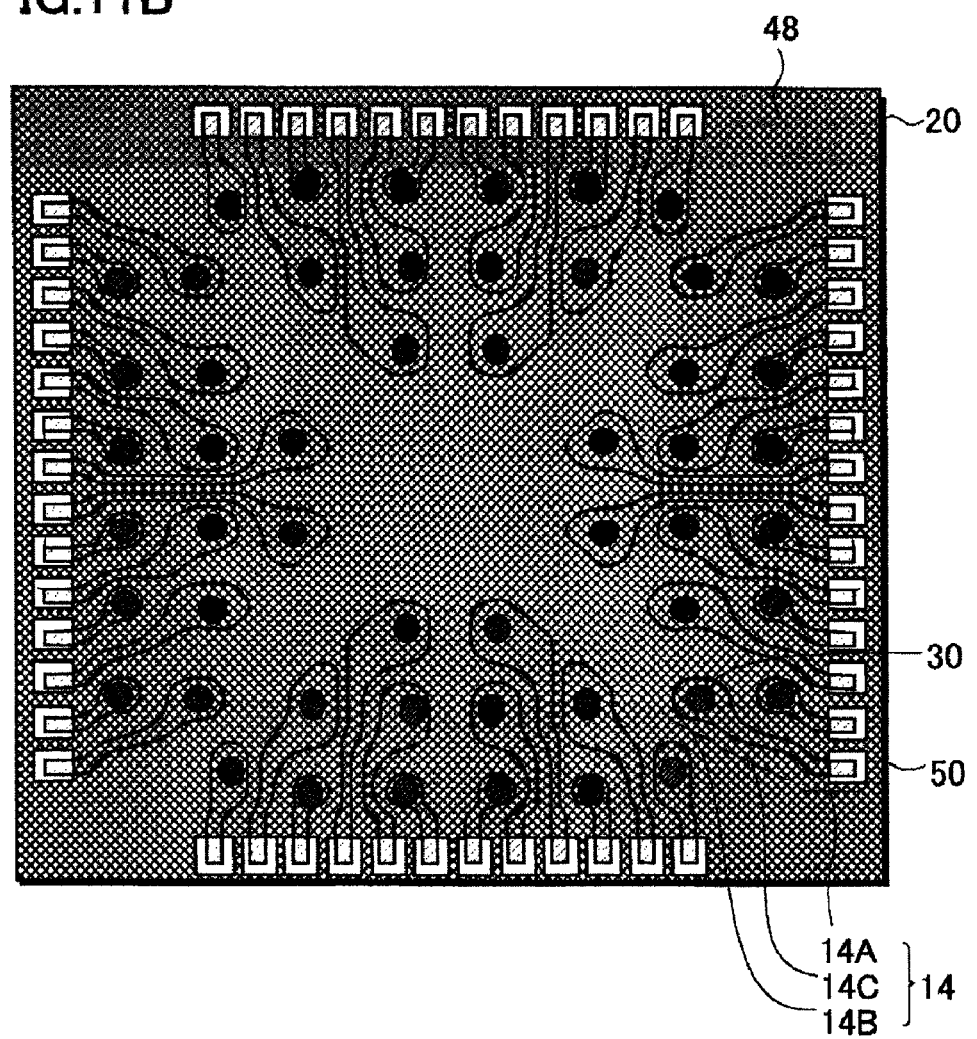
FIG. 11B is a plan view, for illustrating the manufacturing method of the circuit device according to the second preferred embodiment.

Next, as shown in FIGS. 11A and 11B, a plating resist 48 to be used for performing an electroplating process in the next step is formed.

As shown in FIG. 11A, after the plating resist 48 is formed on the entire upper surface of the circuit board 20, the plating resist 48 are partly removed through an exposure and development process. Thereby, the upper and side surfaces of each of the first connection portions 14A, which surfaces are to be provided with a plating film 28, are exposed from openings 50 to the outside.

Figure 12A:
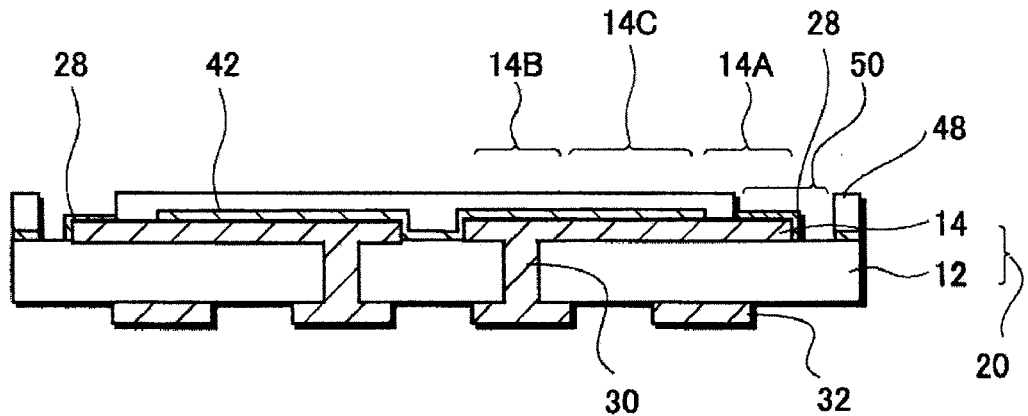
FIG. 12A is a cross-sectional view.

As shown in FIG. 11B, the openings 50 are formed in the plating resist 48 so that the first connection portions 14A of the wirings 14 can be exposed respectively from the openings 50. Here, the openings 50 formed in the plating resist 48 are smaller than the openings 44 formed in the etching resist 46 in a previous step. This means that parts, planarized through the etching in a previous step, of the wirings 14 are exposed from the openings 50 of the plating resist 48. The plating film 28 is adhered to the parts, exposed from the openings 50, of the wirings 14. In the wirings 14, there are also portions that are planarized through the etching in the previous step, and that are not exposed from the openings 50. These portions are to be the second rough regions 38, which are not covered with the plating film 28, as shown in FIG. 2A. As shown in FIG. 12A, in the wirings 14, the portions having the upper surfaces neither covered with the electroless plating film 42 nor exposed from the openings 50 correspond to these parts (the second rough regions 38 in the drawings such as FIG. 2A).

Figure 12B:
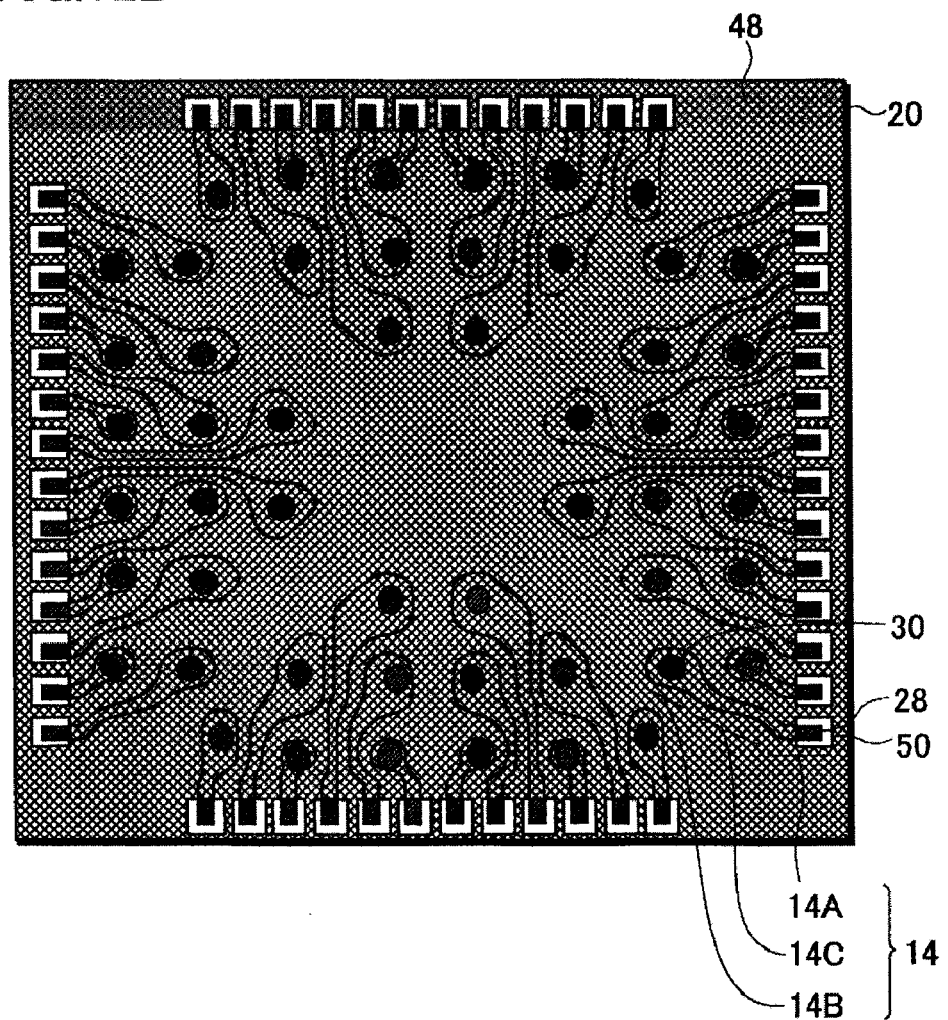
FIG. 12B is a plan view, for illustrating the manufacturing method of the circuit device according to the second preferred embodiment.

Next, as shown in FIGS. 12A and 12B, the plating film 28 is adhered to the surfaces, exposed from the openings 50 of the plating resist 48, of the wirings 14, by means of electroplating.

As shown in FIG. 12A, the parts (first connection portions), exposed from the openings 50 formed in the plating resist 48, of the wirings 14 are caused to be in contact with plating solution, and then, voltage is applied to the electroless plating film 42. Thereby, an electroplating film is formed on the surfaces of the wirings 14. Here, after the electroplating film made of nickel is adhered to the exposed surfaces of the wirings 14, another electroplating film made of gold is adhered to the upper surfaces of the electroplating film made of nickel.

In this step, an electroplating process is performed by using, as an electrode, the electroless plating film 42 entirely covering the surfaces of the wirings 14 and the upper surface of the substrate 12 excluding the parts, within the openings 50, of the upper surface of the substrate 12. Accordingly, tinned wires for electroplating, which are formed between the wirings 14 in a conventional manufacturing method, need not be formed here. Hence, the wirings 14 can be formed closer to each other.

As shown in FIG. 12B, the plating film 28 covering the surfaces of the wirings 14 is formed within the openings 50. In the previous step, the electroless plating film 42 is removed from the parts, exposed from the openings 50, of the upper surface of the substrate 12. Accordingly, the plating film 28 is not adhered to these exposed parts.

Figure 13A:
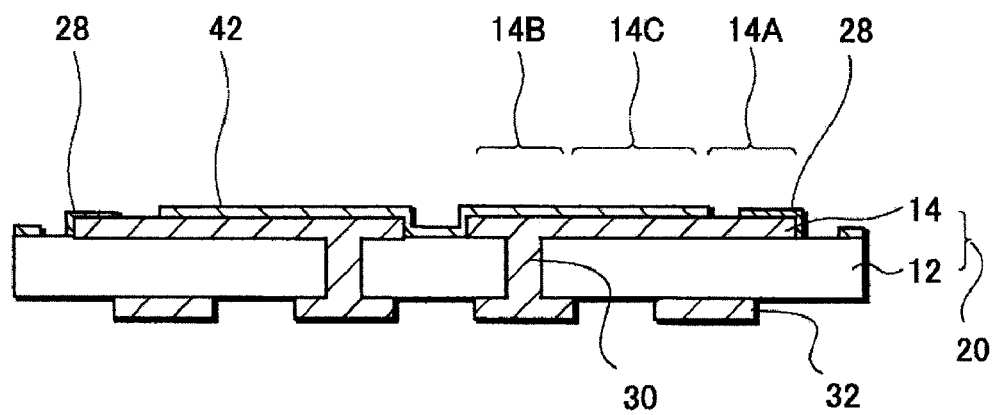
FIG. 13A is a cross-sectional view.
Figure 13B:
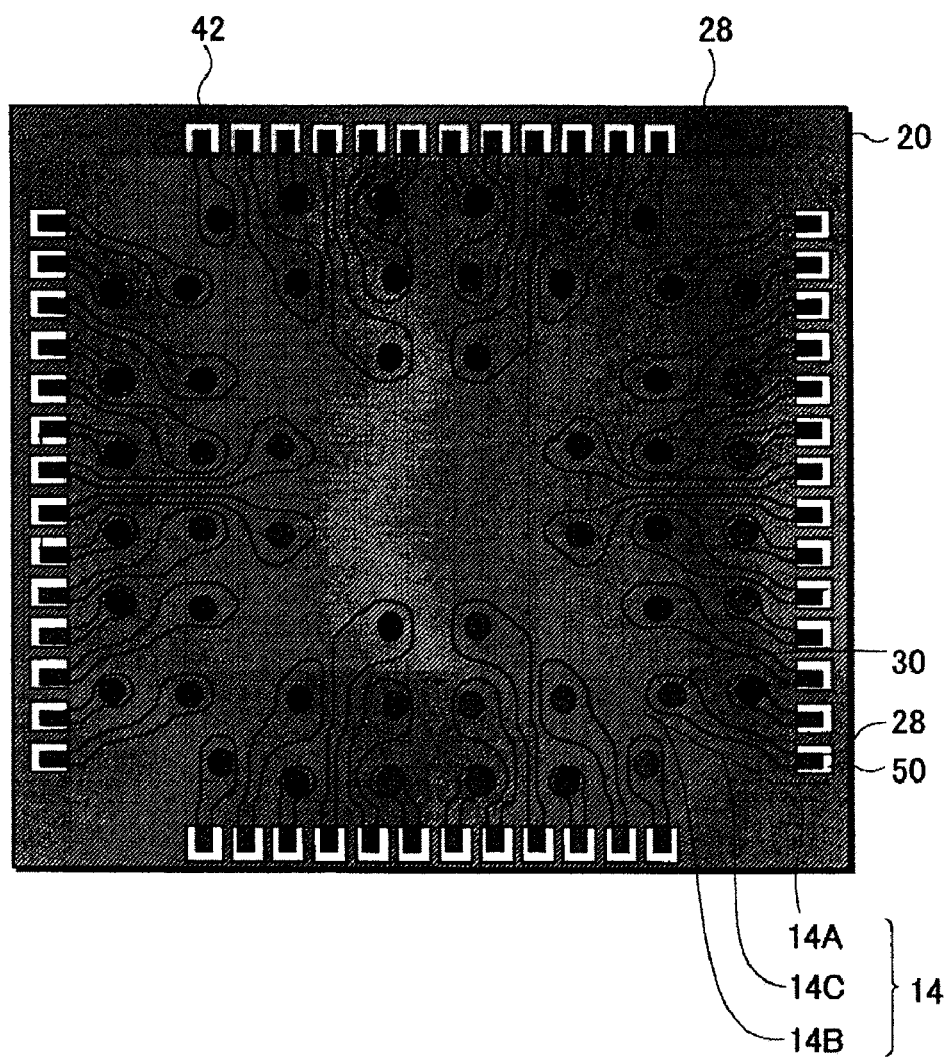
FIG. 13B is a plan view, for illustrating the manufacturing method of the circuit device according to the second preferred embodiment.

After the completion of this step, the plating resist 48 is exfoliated and removed from the upper surface of the circuit board 20. The state of the circuit board 20 after the plating resist 48 is removed is shown in FIGS. 13A and 13B. As shown in FIG. 13B especially, the upper surface, excluding the parts within the openings 50, of the circuit board 20 is covered with the electroless plating film 42 functioning as tinned wires.

Figure 14A:
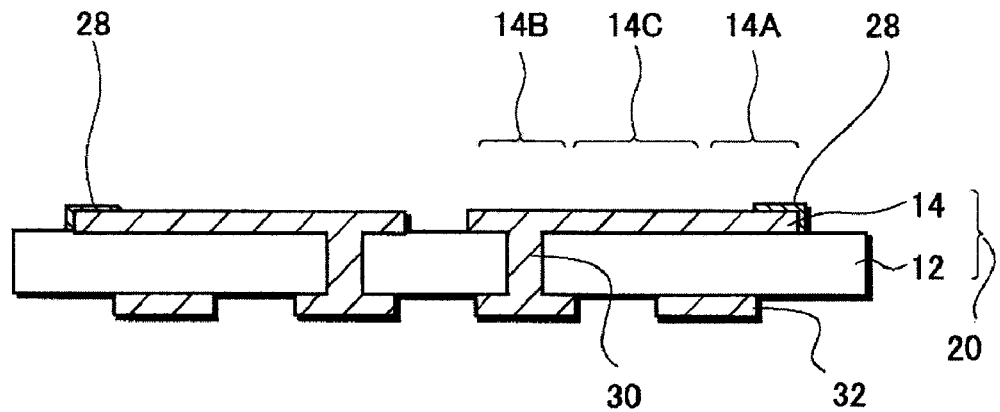
FIG. 14A is a cross-sectional view.
Figure 14B:
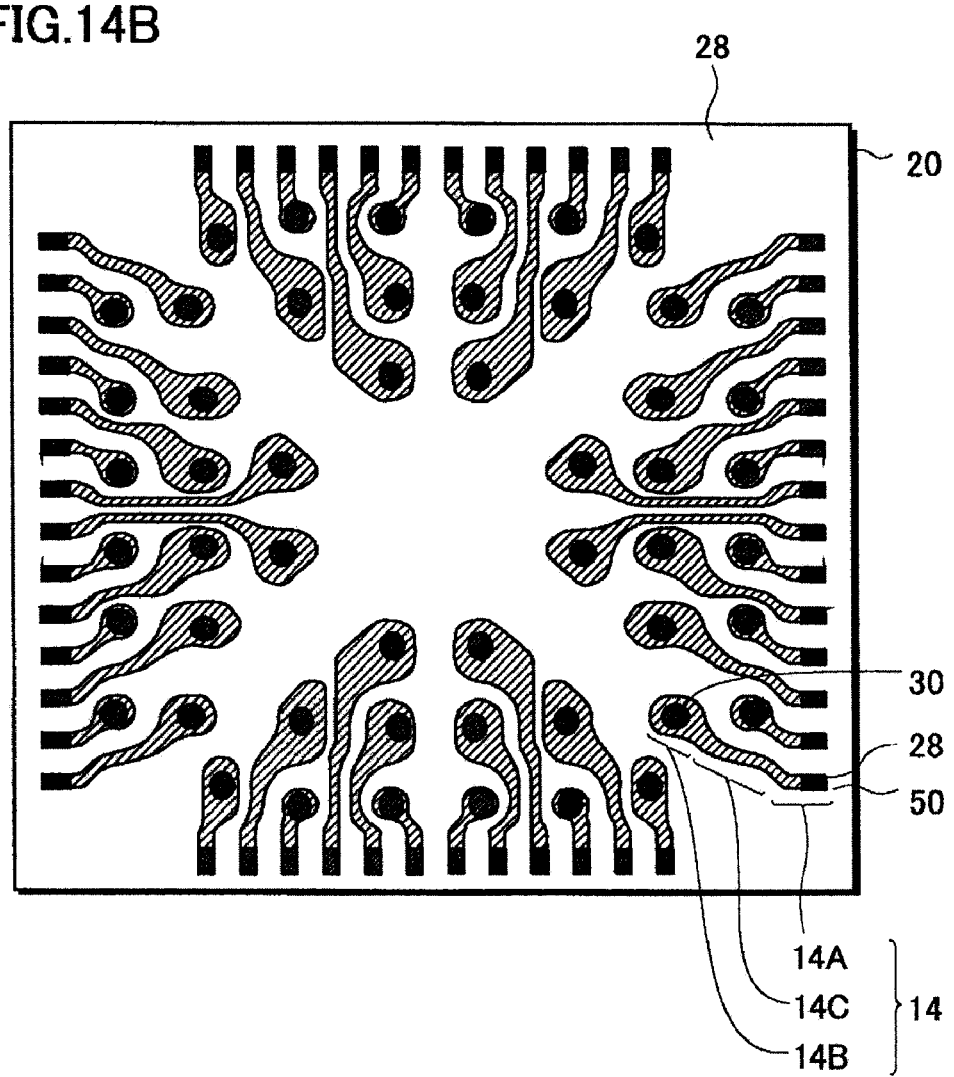
FIG. 14B is a plan view, for illustrating the manufacturing method of the circuit device according to the second preferred embodiment.

Next, as shown in FIGS. 14A and 14B, the electroless plating film 42 used for the electroplating process is entirely removed.

In this step, etching is performed by causing the entire upper surface of the circuit board 20 to be in contact with an etchant without using any etching resist basically. The etching is continuously performed until the electroless plating film 42 covering the upper surface of the substrate 12 is removed. Through this step, the electroless plating film 42 covering the upper surface of the substrate 12 is etched, and the surfaces of all the regions of the wirings 14 are also etched.

By removing the electroless plating film 42 having functioned as tinned wires in the above step, the wirings 14 become electrically independent.

The etchant used in this step has higher selectivity than the etchant used for the etching in the previous step. Specifically, the etchant used in this step is capable of removing the grain boundaries preferentially compared to the surfaces of the crystals. Here, the surfaces of the crystals forming the wirings 14 and the boundaries of the crystals (grain boundaries) are exposed in the surfaces of the wirings 14, while the surfaces of crystals forming the electroless plating and the boundaries of the crystals are exposed in the surface of the electroless plating film 42 on the wirings 14. Thus, crystal grains forming the electroless plating film 42 are smaller than those forming the wirings 14. Specifically, as the etchant used in this step, any etchants but a ferric chloride solution is preferably used.

Accordingly, on the surfaces of the wirings 14, crystal grains larger than those of the electroless plating film 42 are exposed around the first connection portions 14A (in the periphery) where the electroless plating film 42 is removed to form smooth surfaces in a previous etching step, and the widths of the convex portions around the first connection portions 14A are relatively large even after this step. In other words, etching is performed a plurality of times on these portions to form the second rough regions 38 shown in FIG. 2A.

On the other hand, as shown in FIG. 2A, the parts, on which only the etching of this step is performed, of the wirings 14, have the electroless plating film 42 having a relatively small grain size on the surfaces at the time of performing the etching process of this step. Accordingly, these parts are made to be the first rough regions 36 having the convex portions each with a small width on the surfaces.

Figure 15A:
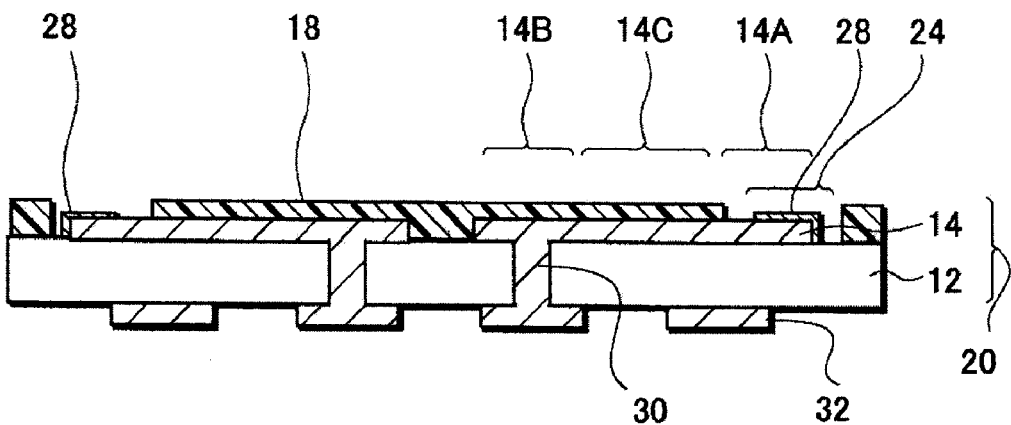
FIG. 15A is a cross-sectional view.
Figure 15B:
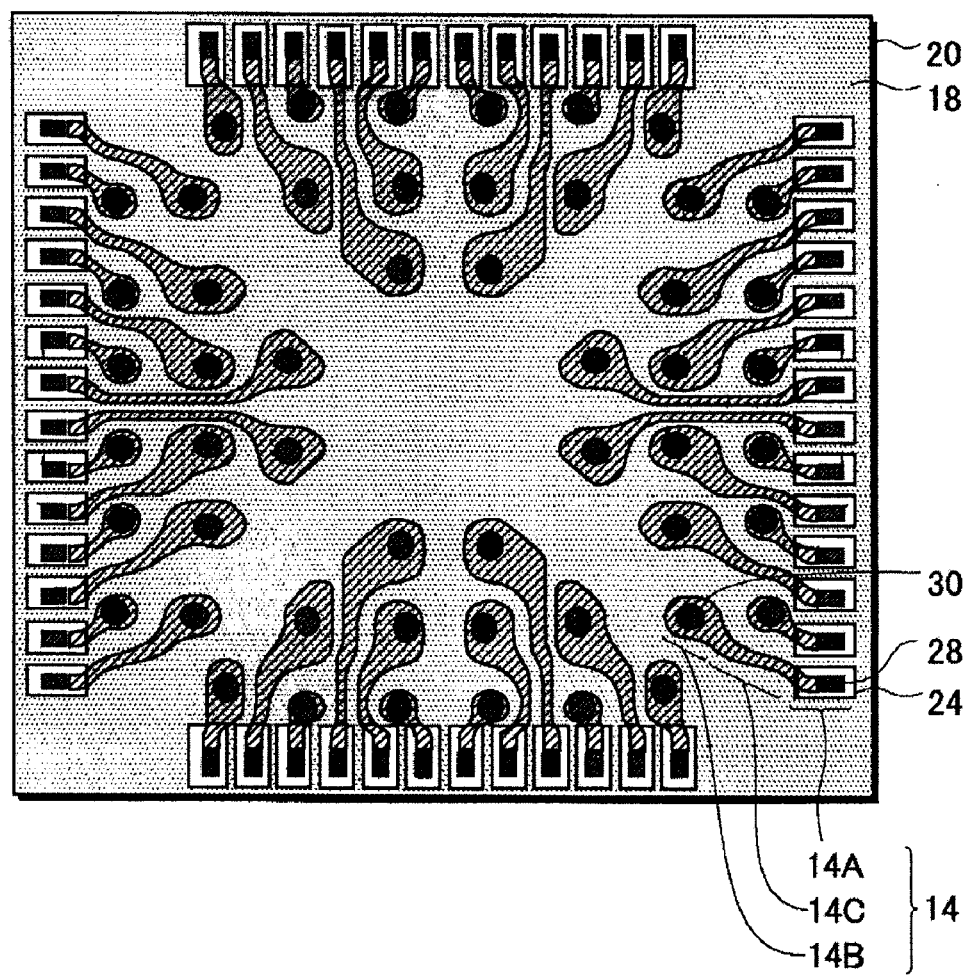
FIG. 15B is a plan view, for illustrating the manufacturing method of the circuit device according to the second preferred embodiment.
Figure 16:
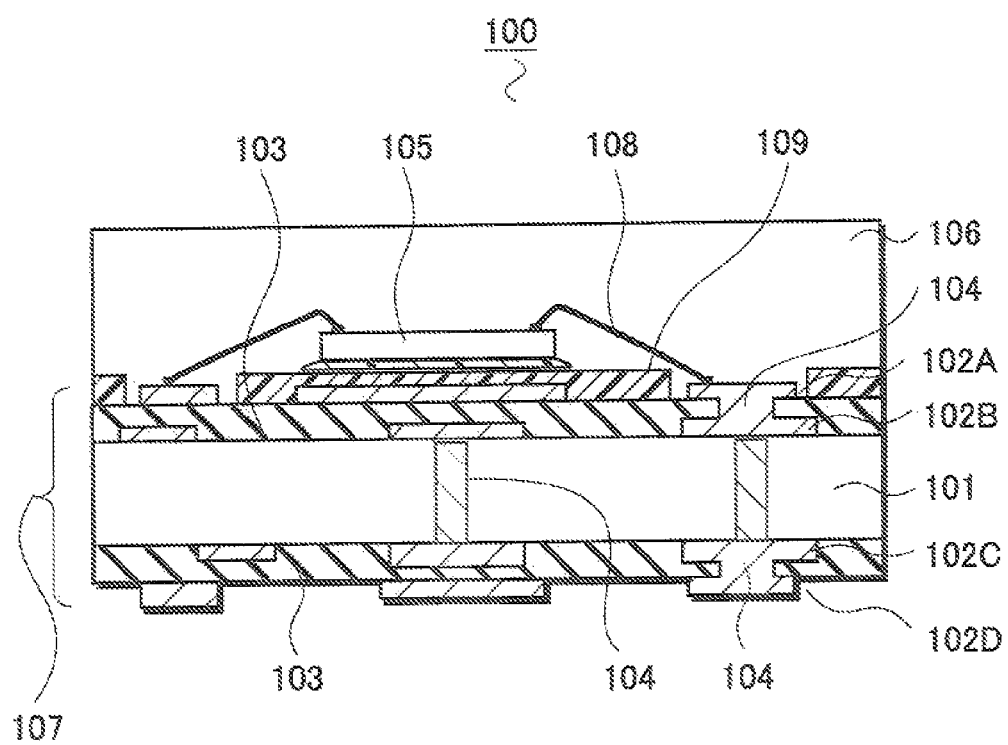
FIG. 16 is a cross-sectional view of a circuit device according to a first related art.
Figure 17:
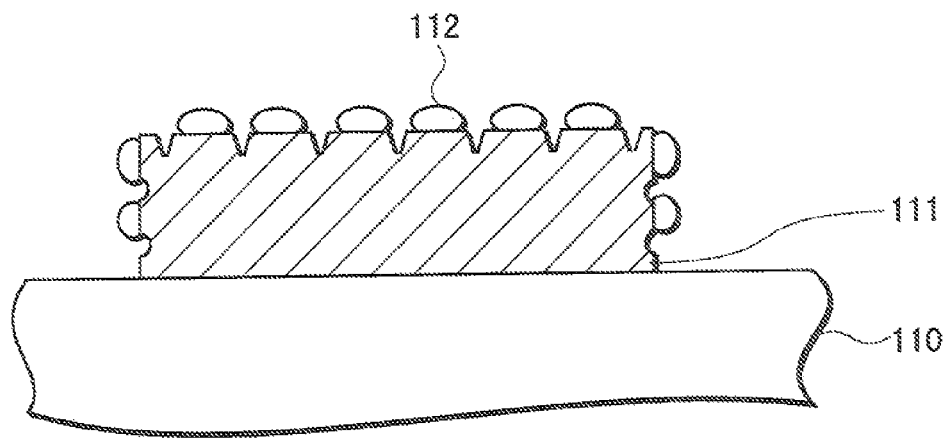
FIG. 17 is a cross-sectional view of a circuit device according to a second related art.

Next, as shown in FIGS. 15A and 15B, the upper surface of the circuit board 20 is covered with a cover layer 18. FIG. 15A is a cross-sectional view of the circuit board 20 in this step, and FIG. 15B is a plan view showing the circuit board 20 seen from the above.

As shown in FIGS. 15A and 15B, firstly, the cover layer 18 made of resin is formed so as to entirely cover the upper surface of the substrate 12 and the surfaces of the wirings 14. Thereafter, openings 24 are formed by removing parts of the cover layer 18 so as to expose the first connection portions 14A of the wirings 14. Thereby, the first connection portions 14A and the plating film 28 are exposed from the openings 24.

In the second preferred embodiment, the metal materials forming the wirings 14 as well as the plating film 28 are exposed from the openings 24. However, the widths of the openings 24 may be narrowed to expose only the plating film 28 from the openings 24 as shown in FIGS. 5A and 5B. In this case, the metal material forming the wirings 14 are entirely covered with the cover layer 18.

Through the above-described steps, the circuit board 20 is manufactured. To manufacture the circuit device 10 shown in FIG. 1, the following steps are also required, for example: a step of adhering the semiconductor element 16 to the circuit board 20 with an insulating adhesive; a step of electrically connecting electrodes of the semiconductor element 16 and the wirings 14 through the thin metallic wires 26; a step of forming the sealing resin 22 on the circuit board 20 so as to seal the semiconductor element 16 and the thin metallic wires 26; and a step of welding the connection electrodes 34 made of solder to the back electrodes 32.

What is claimed is:

1. A circuit board comprising:
   a substrate;
   a wiring formed on a main surface of the substrate, and including connectors disposed along four side edges of the substrate; and
   a cover layer extending over the entire main surface of the substrate other than at openings for the connectors,
   wherein the cover layer is provided with openings for exposing the connectors of the wiring, and the connectors exposed from the openings are covered with a plating film,
   the connectors of the wiring are positioned in a region surrounding a circuit-element-mounting-region where a circuit element is designed to be mounted, the circuit-element-mounting region being defined on the main surface of the substrate, and
   on a surface of the wiring, convex portions in the region surrounding the circuit-element-mounting-region are set larger in width than convex portions in a center part of the circuit-element-mounting-region.

2. The circuit device according to claim 1, wherein an end portion of the plating film is covered with the cover layer.

3. The circuit device according to claim 1, wherein
   part of a conductive material forming the wiring as well as the plating film is exposed from the opening, and
   sealing resin sealing the circuit element is closely adhered to a surface, exposed from the opening, of the plating film, and also to the conductive material forming the wiring.

4. A circuit device comprising:
   a circuit board; and
   a circuit element mounted on the circuit board, wherein
   the circuit board includes:
     a substrate;
     a wiring formed on a main surface of the substrate, and including connectors electrically connected to the circuit element, the connectors disposed along four side edges of the substrate; and
     a cover layer extending over the entire main surface of the substrate other than at openings for the connectors, wherein the connectors exposed from the openings are covered with a plating film, and,
   in the circuit board:
     the connectors of the wiring are positioned in a region surrounding a circuit-element-mounting-region where the circuit element is designed to be mounted, the circuit-element-mounting region being on the main surface of the substrate, and
     on a surface of the wiring, convex portions positioned in the region surrounding the circuit-element-mounting-region are set larger in width than convex portions in a center part of the circuit-element-mounting-region.

5. A circuit device comprising:
   a circuit board; and
   a circuit element mounted on the circuit board, wherein
   the circuit element is a semiconductor element including a plurality of electrodes provided on a main surface thereof, and
   the circuit board includes:
     a substrate;
     a wiring formed on a main surface of the substrate, and including connectors electrically connected to the semiconductor element, the connectors disposed along four side edges of the substrate; and
     a cover layer extending over the entire main surface of the substrate other than at openings for the connectors, wherein the connectors exposed from the openings are covered with a plating film, and,
   in the circuit board,
     the connectors of the wiring are provided in the periphery of the substrate, and
     on a surface of the wiring, convex portions in the periphery of the substrate are set larger in width than convex portions in a center region of the substrate.

6. The circuit device according to claim 5 wherein the wiring comprises a first rough region in which widths of convex portions on the surface are relatively small and a second rough region in which widths of convex portions on the surface are larger than those of the first rough region, and wherein the first rough region and the second rough region are covered by the cover layer.

7. A circuit board comprising:
   a substrate;
   a wiring formed on a main surface of the substrate, and having external terminal portions at four side edges of the substrate; and
   a cover layer having openings for exposing the external terminal portions of the wiring, wherein the cover layer extends over the entire main surface of the substrate other than at the openings, and the external terminal portions exposed from the openings are covered with a plating and
   on a surface, covered with the cover layer, of the wiring, convex portions in a region around the periphery of the opening are set larger in width than convex portions outside the region around the periphery of the opening.

* * * * *